United States Patent
Hsiao et al.

(10) Patent No.: US 10,642,436 B2
(45) Date of Patent: May 5, 2020

(54) TOUCH SENSING PANEL AND MANUFACTURING METHOD THEREOF

(71) Applicant: Cambrios Film Solutions Corporation, Tortola (VG)

(72) Inventors: Chung-Chin Hsiao, Zhubei (TW); Siou-Cheng Lien, Toufen (TW); Chia-Yang Tsai, New Taipei (TW)

(73) Assignee: Cambrios Film SOlutions Corporation, Tortola (VG)

( * ) Notice: Subject to any disclaimer, the term of this patent is extended or adjusted under 35 U.S.C. 154(b) by 0 days.

(21) Appl. No.: 16/441,256

(22) Filed: Jun. 14, 2019

(65) Prior Publication Data

US 2019/0384429 A1   Dec. 19, 2019

(30) Foreign Application Priority Data

Jun. 15, 2018 (CN) .......................... 2018 1 0623072

(51) Int. Cl.
 *G06F 3/044* (2006.01)
 *B32B 15/02* (2006.01)
 *B81C 1/00* (2006.01)

(52) U.S. Cl.
 CPC .............. *G06F 3/044* (2013.01); *B32B 15/02* (2013.01); *B81C 1/00595* (2013.01)

(58) Field of Classification Search
 CPC ................ G06F 3/044; G06F 3/04164; G06F 2203/04103; B32B 15/02; B81C 1/00595
 See application file for complete search history.

(56) References Cited

U.S. PATENT DOCUMENTS

| 2014/0204290 A1* | 7/2014 | Chen ....................... G06F 3/044 349/12 |
| 2017/0147119 A1* | 5/2017 | Hotelling ............. G09G 3/3648 |
| 2017/0154704 A1 | 6/2017 | Kanna |

FOREIGN PATENT DOCUMENTS

| TW | 201508777 A | 3/2015 |
| TW | 201730257 A | 9/2017 |
| TW | M561254 U | 6/2018 |

* cited by examiner

*Primary Examiner* — Abbas I Abdulselam
(74) *Attorney, Agent, or Firm* — Cooper Legal Group, LLC

(57) ABSTRACT

A touch sensing panel includes a substrate, a touch sensing electrode, an etching-inhibition unit, and a peripheral trace. The substrate includes a touch sensing area and a peripheral area. The touch sensing electrode and the peripheral trace are respectively formed on the touch sensing area and the peripheral area, and the etching-inhibition unit is at least formed on the touch sensing area. The touch sensing electrode is electrically connected with the peripheral trace and includes a first part of a metal nanowire layer, which is patterned. The peripheral trace includes a metal layer and a second part of the metal nanowire layer. The metal layer directly contacts the second part of the metal nanowire layer. The metal layer and the second part of the metal nanowire layer have a co-planar etch-surface.

23 Claims, 18 Drawing Sheets

TOUCH SENSING PANEL AND MANUFACTURING METHOD THEREOF

CROSS REFERENCE TO RELATED APPLICATIONS

This Non-provisional application claims priority under 35 U.S.C. § 119(a) to Patent Application No. 201810623072.X filed in People's Republic of China on Jun. 15, 2018, the entire contents of which are hereby incorporated by reference.

BACKGROUND

Technology Field

This disclosure relates to a touch sensing panel and a manufacturing method thereof.

Description of Related Art

Transparent conductive materials, which have good light transmission and electrical conductivity, are generally applied in various display panels or touch sensing panels. Transparent conductive materials include metal oxides, such as indium tin oxide (ITO), indium zinc oxide (IZO), cadmium tin oxide (CTO), or aluminum-doped zinc oxide (AZO). Other kinds of transparent conductive materials, including metal nanowires, are particularly suited to flexible substrates.

However, when using the nanowires to manufacture the touch sensing electrodes, there are many problems in manufacturing processes and structures to be solved. For example, the etching solution used in the conventional process is mostly strongly acidic, and the etching solution may attack the nanowires, which may decrease the optical properties or electrical properties of the products, e.g. by increasing the resistance of the nanowire layer after the etch step. In addition, the etching rate and etching selectivity of the etching solution for different materials are also important issues to be studied.

Moreover, in the manufacturing process of utilizing the nanowires to form the touch sensing electrodes, a high contact resistance between the nanowires and the metal trace in the peripheral area may occur.

SUMMARY

Some embodiments of this disclosure provide a manufacturing method of a touch sensing panel that can solve the above problems and has advantages of high manufacturing efficiency, lower circuit impedance, and good optical and electrical properties of the touch sensing applications.

Some embodiments of this disclosure provide a touch sensing panel comprising a substrate, a touch sensing electrode, an etching-inhibition unit and a peripheral trace. The substrate comprises a touch sensing area and a peripheral area. The touch sensing electrode is formed on the touch sensing area of the substrate. The etching-inhibition unit is formed at least on the touch sensing area. The peripheral trace is formed on the peripheral area of the substrate, and the touch sensing electrode is electrically connected with the peripheral trace. The touch sensing electrode comprises a first portion of a patterned metal nanowire layer, and the peripheral trace comprises a metal layer and a second portion of the metal nanowire layer. The metal layer directly contacts the second portion of the metal nanowire layer. The metal layer and the second portion of the metal nanowire layer have a co-planar sidewall which is an etch-surface.

In some embodiments of this disclosure, the etching-inhibition unit comprises an etching inhibitor added in the metal nanowire layer, and both the touch sensing electrode and the peripheral trace comprise the etching inhibitor.

In some embodiments of this disclosure, the metal nanowire layer is added with about 1%~10% of the etching inhibitor by weight.

In some embodiments of this disclosure, the touch sensing panel further comprises an overcoat layer formed on the metal nanowire layer, and the etching-inhibition unit comprises an etching inhibitor added in the overcoat layer.

In some embodiments of this disclosure, the etching-inhibition unit comprises an anti-etching layer formed on the metal nanowire layer (i.e., the first portion of the metal nanowire layer), and the touch sensing electrode and the anti-etching layer have the same pattern.

In some embodiments of this disclosure, the anti-etching layer is a patterned photoresist material, and the photoresist material is formed on the touch sensing area and not formed on the peripheral area.

In some embodiments of this disclosure, the touch sensing electrode comprises a first touch sensing electrode disposed on an upper surface of the substrate and a second touch sensing electrode disposed on a lower surface of the substrate. The etching-inhibition unit comprises a first anti-etching layer disposed on the first touch sensing electrode and a second anti-etching layer disposed on the second touch sensing electrode. The first touch sensing electrode and the first anti-etching layer have the same pattern, and the second touch sensing electrode and the second anti-etching layer have the same pattern.

In some embodiments of this disclosure, the first anti-etching layer and the second anti-etching layer are made of photoresists with the same wavelength absorption property. In addition, the first anti-etching layer absorbs greater than about 80% of total energy of lights emitted from a first light source, and the second anti-etching layer absorbs greater than about 80% of total energy of lights emitted from a second light source.

In some embodiments of this disclosure, the first anti-etching layer and the second anti-etching layer are made of photoresists with the same wavelength absorption property, and the first anti-etching layer and the second anti-etching layer are added with about 0.1%~10% of a light absorption additive by weight.

In some embodiments of this disclosure, the first anti-etching layer and the second anti-etching layer are made of photoresists with different wavelength absorption properties. The first anti-etching layer is made of a first photoresist and the second anti-etching layer is made of a second photoresist, wherein the first and the second photoresists are sensitive with lights in different wavelength ranges.

Some embodiments of this disclosure provide a manufacturing method of a touch sensing panel, comprising: providing a substrate, wherein the substrate comprises a touch sensing area and a peripheral area; forming a metal nanowire layer made of metal nanowires on the substrate, wherein the metal nanowire layer comprises a first portion on the touch sensing area and a second portion on the peripheral area; forming an etching-inhibition unit, wherein the etching-inhibition unit is formed at least on the touch sensing area; forming a metal layer on the metal nanowire layer, wherein the metal layer comprises a first portion on the touch sensing area and a second portion on the peripheral area; removing the first portion of the metal layer; and performing a patterning process, wherein the patterning process comprises: patterning the first portion of the metal nanowire layer to form a touch sensing electrode on the touch sensing area and simultaneously patterning the second portion of the metal layer and the second portion of the metal nanowire layer to form a peripheral trace on the peripheral area.

In some embodiments of this disclosure, the step of forming the etching-inhibition unit comprises adding an etching inhibitor in the metal nanowire layer.

In some embodiments of this disclosure, the metal nanowire layer is added with about 1%~10% of the etching inhibitor by weight.

In some embodiments of this disclosure, the step of removing the first portion of the metal layer comprises utilizing a first etching solution to remove the first portion of the metal layer; and after the step of removing the first portion of the metal layer on the touch sensing area, a variation of a resistance value of the metal nanowire layer is less than about 10%.

In some embodiments of this disclosure, the step of performing the patterning process comprises utilizing a second etching solution to etch the first and the second portions of the metal nanowire layer, and the second portion of the metal layer.

In some embodiments of this disclosure, the step of forming the etching-inhibition unit comprises forming a patterned anti-etching layer on the first portion of the metal nanowire layer.

In some embodiments of this disclosure, the step of removing the first portion of the metal layer and the step of performing the patterning process are performed simultaneously with one etching solution.

In some embodiments of this disclosure, the step of forming the metal nanowire layer made of the metal nanowires on the substrate comprises: forming a first metal nanowire layer on an upper surface of the substrate and forming a second metal nanowire layer on a lower surface of the substrate.

In some embodiments of this disclosure, the step of forming the etching-inhibition unit comprises: forming a patterned first anti-etching layer on the first metal nanowire layer and forming a patterned second anti-etching layer on the second metal nanowire layer; and the step of forming the metal layer on the metal nanowire layer comprises: forming a first metal layer on the first metal nanowire layer and forming a second metal layer on the second metal nanowire layer.

In some embodiments of this disclosure, the step of removing the first portion of the metal layer and the step of performing the patterning process are performed simultaneously with one etching solution. The etching solution is used to simultaneously pattern a first portion of the first metal nanowire layer to form a first touch sensing electrode on the touch sensing area based on the patterned first anti-etching layer, to pattern a first portion of the second metal nanowire layer to form a second touch sensing electrode on the touch sensing area based on the patterned second anti-etching layer, and to pattern a second portion of the first metal layer, a second portion of the first metal nanowire layer, a second portion of the second metal layer and a second portion of the second metal nanowire layer to form a peripheral trace on the upper and the lower surfaces of the substrate in the peripheral area.

In some embodiments of this disclosure, the first anti-etching layer and the second anti-etching layer are made of photoresists with the same wavelength absorption property, the first anti-etching layer absorbs greater than about 80% of total energy of lights emitted from a first light source, and the second anti-etching layer absorbs greater than about 80% of total energy of lights emitted from a second light source.

In some embodiments of this disclosure, the first anti-etching layer and the second anti-etching layer are made of photoresists with the same wavelength absorption property, and the first anti-etching layer and the second anti-etching layer are added with about 0.1%~10% of a light absorption additive by weight. A light absorption additive is added to the first anti-etching layer and/or the second anti-etching layer at about 0.1%-10% by weight.

In some embodiments of this disclosure, the first anti-etching layer and the second anti-etching layer are made of photoresists with different wavelength absorption properties. The first anti-etching layer is made of a first photoresist and the second anti-etching layer is made of a second photoresist, wherein the first and the second photoresists are sensitive with lights in different wavelength ranges.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1:
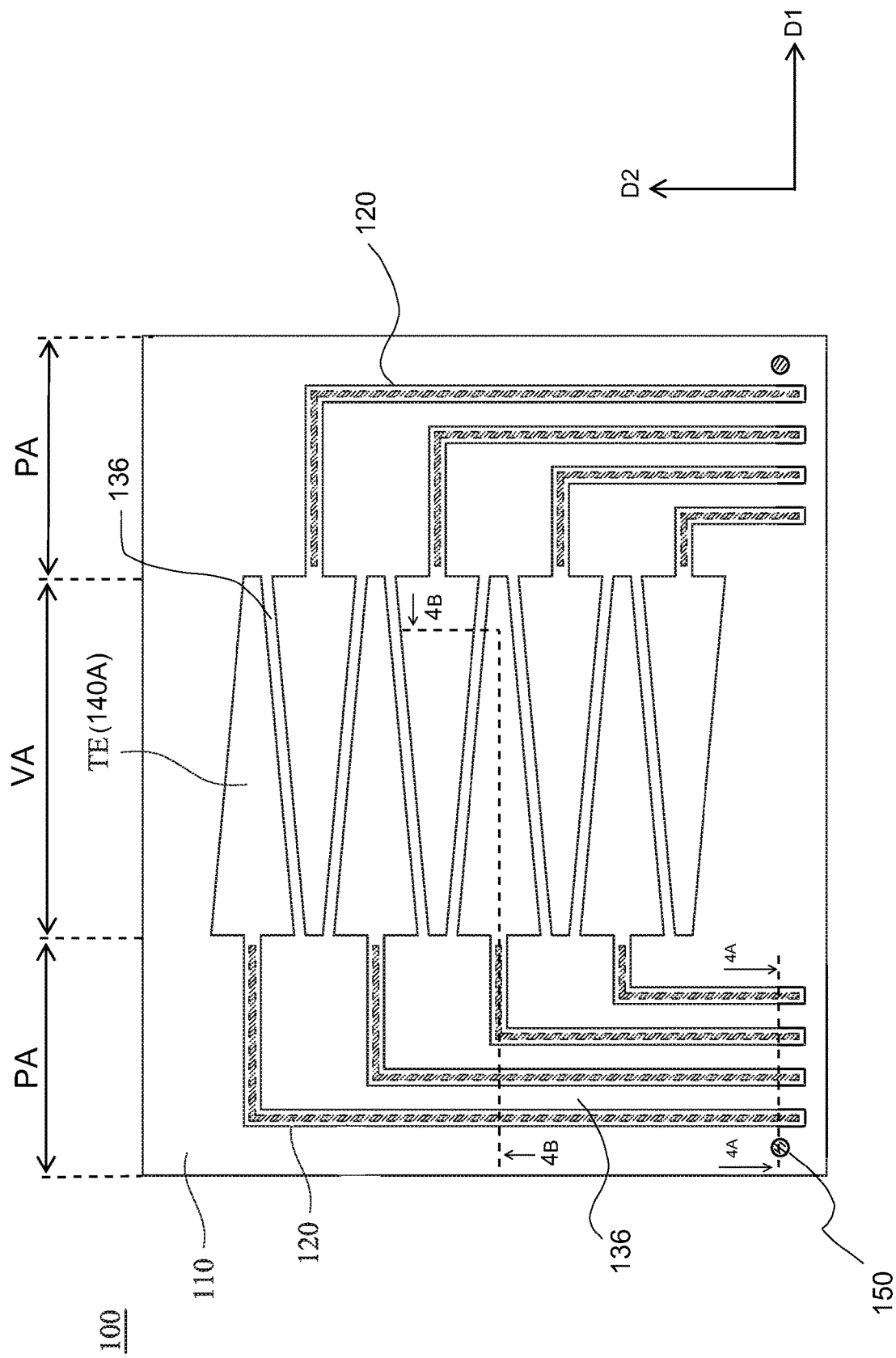
FIG. 1 is a schematic diagram showing the touch sensing panel according to some embodiments of this disclosure.

The various embodiments of the present disclosure are illustrated in the drawings, and the practical details will be described in the following embodiments. However, it should be understood that these practical details are not intended to limit the disclosure. That is, in some embodiments of the disclosure, these practical details are not necessary. In addition, some of the conventional structures and elements are shown in the drawings in a simplified manner.

As used herein, "about" is generally a deviation or a range within 20% of a value, preferably a range within 10%, and more preferably a range within 5%. Unless otherwise stated, the numerical values mentioned in this disclosure are considered as approximations, that is, they have an error or a range as indicated by "about".

In this embodiment, a touch sensing panel 100 comprises a substrate 110, one or more peripheral traces 120 at least including a metal layer 120A and a metal nanowire layer 140A, one or more touch sensing electrodes TE at least including the metal nanowire layer 140A, and an etching-inhibition unit formed on a touch sensing area VA defined on the substrate 110. FIG. 1 is a top view of the touch sensing panel 100 according to some embodiments of this disclosure. The touch sensing panel 100 comprises a substrate 100, a plurality of peripheral traces 120, a plurality of touch sensing electrodes TE, and an etching-inhibition unit formed on the touch sensing area VA. The etching-inhibition unit comprises etching inhibitor(s) added in the metal nanowire layer 140A on the touch sensing area VA. The amounts of the peripheral trace 120 and the touch sensing electrode TE disclosed in the following embodiments and figures are for illustrations only, and not for limiting the scope of this disclosure.

Referring to FIG. 1, the substrate 110 has a touch sensing area VA and a peripheral area PA, and the peripheral area PA is disposed at one or more sides of the touch sensing area VA. For example, the peripheral area PA can be frame-shape disposed at four sides of the touch sensing area VA (including a top side, a bottom, a left side and a bottom side). In other embodiments, the peripheral area PA can be L-shape disposed at two adjacent sides of the touch sensing area VA (e.g., the left side and the bottom side). As shown in FIG. 1, this embodiment includes eight peripheral traces 120 disposed on the peripheral area PA of the substrate 110, and the touch sensing electrodes TE are disposed on the touch sensing area VA of the substrate 110. An One-time etch process is performed to simultaneously pattern the metal nanowire layer 140A and the metal layer 120A on the peripheral area PA to form the peripheral traces 120 by a single etching step in the embodiment. Accordingly, the stacked upper and lower layers (i.e., the metal nanowire layer 140A and the metal layer 120A) can be patterned without the alignment step, thereby reducing or avoiding the requirement for arranging the alignment deviation area so as to decrease the width of the peripheral area PA and achieve the narrow border/slim border/ultra-slim border requirement of the display devices. In addition, this embodiment can also prevent the decrease of production yield due to the deviations of patterning after multiple alignment steps.

Figure 2:
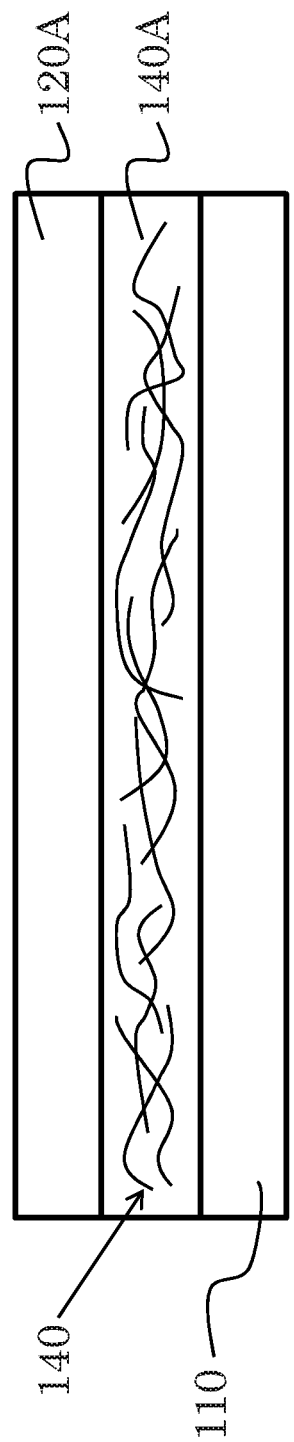
FIG. 2 is a schematic diagram showing the first step of the manufacturing method of the touch sensing panel according to some embodiments of this disclosure.

The manufacturing method of a touch sensing panel of this embodiment comprises: providing a substrate 110; forming a metal nanowire layer 140A made of metal nanowires 140 on the substrate 110; forming an etching-inhibition unit, wherein the etching-inhibition unit is at least formed on the touch sensing area VA; forming a metal layer 120A on the metal nanowire layer 140A; and performing a patterning process to form a touch sensing electrode TE and a peripheral trace simultaneously. Specifically, in this embodiment, a substrate 110 is provided as shown in FIG. 2. In some embodiments of this disclosure, the substrate 110 is a transparent substrate. In more detailed, the substrate 110 can be a rigid transparent substrate or a flexible transparent substrate, and the material thereof can be selected from any of the transparent materials including glass, polymethylmethacrylate (PMMA), polyvinyl chloride (PVC), polypropylene (PP), polyethylene terephthalate (PET), polyethylene naphthalate (PEN), polycarbonate (PC), and polystyrene (PS).

Next, referring to FIG. 2, a metal nanowire layer 140A and a metal layer 120A are formed on the substrate 110. The metal nanowire layer 140A can be at least formed by metal nanowires 140. Specifically, an ink/solution containing the metal nanowires 140 is coated on the substrate 110, and the metal nanowires 140 can coat on the surfaces of the substrate 110 after the drying process. In other words, after the drying process, the metal nanowires 140 can form a physical layer 140A of the metal nanowires on the substrate 110. The substrate 110 can be defined with a touch sensing area VA and a peripheral area PA (as shown in FIG. 1) The metal nanowire layer 140A may comprise a first portion formed on the touch sensing area VA and a second portion formed on the peripheral area PA. In more detailed, in the touch sensing area VA, the first portion of the metal nanowire layer 140A can be directly attached onto the surface of the substrate 110 whereas the second portion of the metal nanowire layer 140A can be directly attached onto the surface of the substrate 110 in the peripheral area PA.

In the embodiment of this disclosure, the ink/solution containing the metal nanowires 140 may comprise the solvent, such as water, alcohol, ketone, ether, hydrocarbon or aromatic solvent (e.g. benzene, toluene, xylene, etc.). The ink may also comprise additives, interface active agent or binder, such as carboxymethyl cellulose (CMC), 2-hydroxyethyl cellulose (HEC), hydroxypropyl methylcellulose (HPMC), sulfonic acid ester, sulfate, disulfonate, sulfosuccinate, phosphate or fluorosurfactant, and the likes. The metal nanowire layer may be, for example, a silver nanowire layer, a gold nanowire layer or a copper nanowire layer. In more detailed, the term "metal nanowire" as used herein is a collective term that refers to a plurality of elemental metals, metal alloys or metal compounds (for example but not limited to metal oxides), wherein the number of metal nanowires contained therein does not affect the claimed protection range. In addition, at least one cross-sectional dimension of the single metal nanowire (i.e., the diameter of the cross-section) is less than about 500 nm, preferably less than about 100 nm, and more preferably less than about 50 nm. The metal nanostructure of the "wires" in this disclosure mainly has a high aspect ratio, for example, between about 10 and 100,000. Specifically, the aspect ratio (i.e., a ratio of length to diameter of the cross-section) of the metal nanowire may be greater than about 10, preferably greater than about 50, and more preferably greater than about 100. The metal nanowires may be made of any metal including, for example but not limited to, silver, gold, copper, nickel and gold-plated silver. Other terms, such as silk, fiber, tube, etc., which also have the above-mentioned dimensions and high aspect ratios, are also within the scope of the present disclosure.

The ink containing metal nanowires 140 can be coated on the surface of the substrate 110 by any method such as, for example but not limited to, a screen printing, a nozzle coating, a roller coating, etc. In one embodiment, a roll to roll process can be used to apply the ink containing metal nanowires 140 to the surface of a continuous supplied substrate 110. After the curing/drying step described above, the solvent can be evaporated and the metal nanowires 140 can be distributed on the surfaces of the photo-sensitive layer in a random manner. Preferably, the metal nanowires 140 can be fixed on the surface of the substrate 110 so as to form the metal nanowire layer 140A. The metal nanowires 140 can contact with each other for providing a continuous current path, thereby forming a conductive network.

In some embodiments of this disclosure, the metal nanowires 140 can be silver nanowires or silver nanofibers having an average diameter of about 20-100 nm and an average length of about 20-100 μm, and preferably an average diameter of about 20-70 nm and an average length of about 20-70 μm. That is, the aspect ratio thereof is about 1000. In some embodiments, the diameter of the metal nanowires 140 is between about 70 nm and 80 nm, and the length thereof is about 8 μm.

In the embodiment, the metal layer 120A can be formed by the step of: disposing the metal material on the metal nanowire layer 140A by a suitable manufacturing process. For example, an electrical conductive metal (e.g. a single-layer silver, a single-layer copper, or a multi-layer material (Mo/Al/Mo, Cu/Ni, Ti/Al/Ti, or Mo/Cr)) is formed on the metal nanowire layer 140A. Similar to the metal nanowire layer 140A, the metal layer 120A also comprises a first portion formed on the touch sensing area VA and a second portion formed on the peripheral area PA. The first portion of the metal layer 120A will be removed in the following process. The second portion of the metal layer 120A is stacked on the second portion of the metal nanowire layer 140A, and the stacked two layers are patterned to form the peripheral trace 120.

Figure 3:
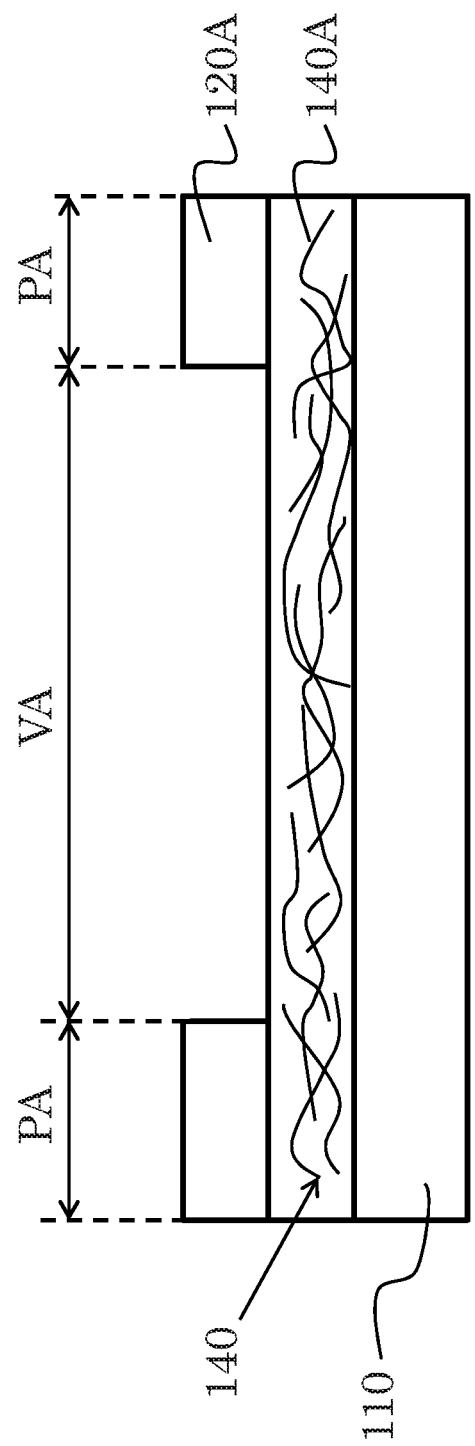
FIG. 3 is a schematic diagram showing the second step of the manufacturing method of the touch sensing panel according to some embodiments of this disclosure.

Then, the first patterning process is performed for patterning the metal layer 120A on the touch sensing area VA (see FIG. 3). In practice, the photosensitive material (e.g., a photoresist) is treated by the exposure/developing process (as known as the lithography process) to define the pattern, which exposes the first portion of the metal layer 120A on the touch sensing area VA. Next, the etching process is performed to remove the first portion of the metal layer 120A on the touch sensing area VA, thereby exposing the metal nanowire layer 140A on the touch sensing area VA. In other words, there is no material of the metal layer 120A on the first portion of the metal nanowire layer 140A on the touch sensing area VA.

In the above etching process, an etchant/etching solution (i.e., the first etching solution) is used to etch/remove the metal layer 120A on the first portion of the metal nanowire layer 140A on the touch sensing area VA. In order to prevent from the attack to the metal nanowire layer 140A by the etchant (i.e., the first etching solution), which may cause the increasing resistance/impedance on the metal nanowire layer 140A, the metal nanowire layer 140A is added with the etching inhibitor(s), which is configured to form the etching-inhibition unit distributed in the metal nanowire layer 140A. In the embodiment, the added etching inhibitor is distributed on both the touch sensing area VA and the peripheral area PA. For example, in condition that the metal nanowire layer 140A is a silver nanowire layer and the metal layer 120A is a copper layer, the etching solution can etch the copper layer, and the silver nanowire layer is added with about 1~10% of etching inhibitor for protecting the silver nanowire layer from the attack of the copper etching solution. In one specific embodiment, the copper etching solution mainly contains $CH_3COOH$ and $NH_4OH$, and the etching inhibitor (mainly contains lithium salt (20%~50%) dissolved in solvent) is added in the silver nanowire layer. This addition of the etching inhibitor can extend the etching time to totally etch/remove the silver nanowire layer by the above-mentioned copper etching solution. In other words, the etch rate of the etchant to the silver nanowire layer is reduced because of the addition of the etching inhibitor. The following Table 1 shows the etching time to totally etch/remove the silver nanowire layers added with different ratios of etching inhibitor by the above-mentioned copper etching solution.

TABLE 1

| Added ratio of etching inhibitor (wt %) | 1 | 3 | 5 |
|---|---|---|---|
| Complete etching time (second) | 20 | 40 | 140 |

Figure 5:
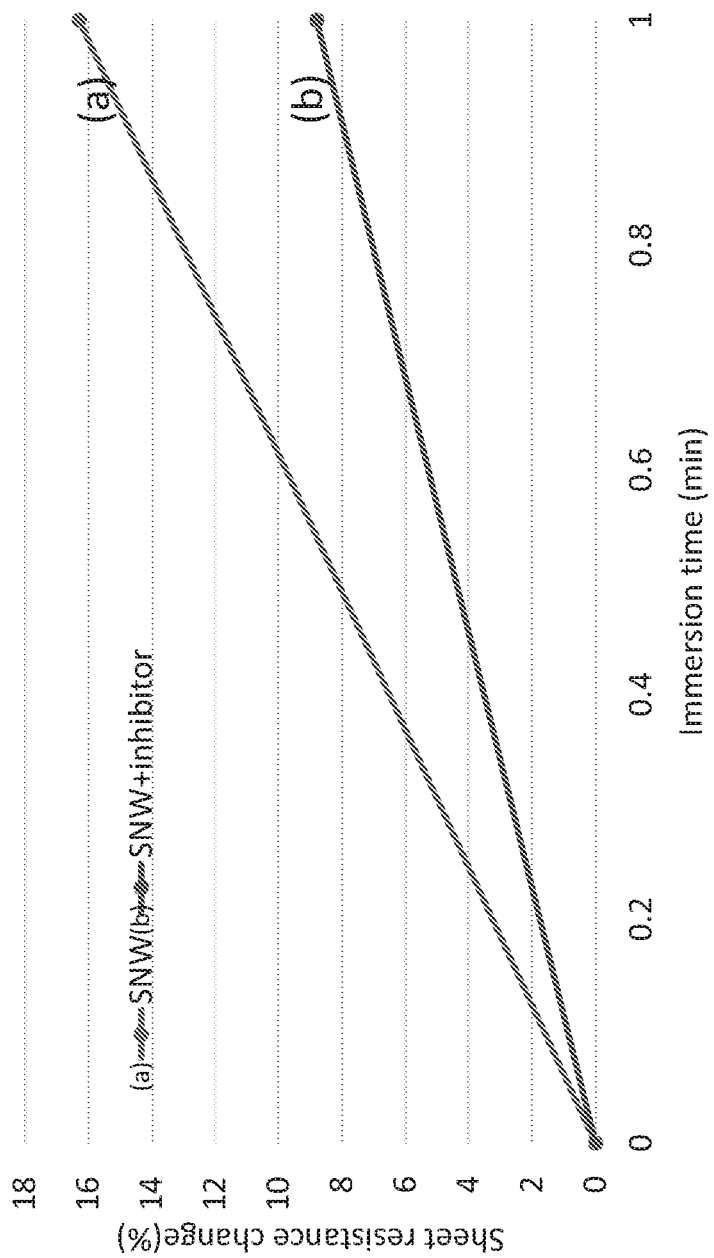
FIG. 5 is a schematic diagram showing the variations of resistance values of the nano-silver layer added with and without the etching inhibitor.

FIG. 5 shows the comparison results of the silver nanowire layer added with 3% by weight of etching inhibitor and the silver nanowire layer without adding the etching inhibitor after the etch process. After the above-mentioned copper etching step, the variation of the resistance of the silver nanowire layer added with the etching inhibitor can be controlled below about 10% whereas the variation of the resistance of the silver nanowire layer is about 16-18%. This result indicates that the added etching inhibitor can reduce the influence of the copper etching solution on the silver nanowire layer. Regarding the resistance variations of the silver nanowire layers, after the etching step, the resistance variation of the silver nanowire layer without adding the etching inhibitor is almost twice of the resistance variation of the silver nanowire layer added with the etching inhibitor. In the embodiment, the concentration of the added etching inhibitor incorporated in the silver nanowire layer is about 1%~5% by weight or by volume, and preferably about 5% by weight or by volume, about 3% by weight or by volume, or about 1% by weight or by volume.

In one embodiment, the etching inhibitor can be mixed in the ink containing the metal nanowires 140, so that the etching inhibitor is incorporated in the dried/cured metal nanowire layer 140A.

In one embodiment, an overcoat layer (not shown) can be formed on the metal nanowire layer 140A, and the etching inhibitor can be mixed in the polymer material of the overcoat layer. The added ratio of the etching inhibitor can be referred to the above embodiment. The overcoat layer may be formed on both the first and second portions of the metal nanowire layer 140A. After the curing process, the overcoat layer and the metal nanowire layer 140A construct a composite structure layer having the above-mentioned anti-etching property. In one embodiment, the polymer containing the etching inhibitor or a mixture thereof can be formed on the metal nanowire layer 140A by suitable coating methods. The polymer penetrates into the gaps/space between the metal nanowires 140 to form a filler or a matrix, and then the material is cured to form the overcoat layer. In other words, the metal nanowires 140 are embedded in the overcoat layer. In one embodiment, the curing process comprises: heating the above-mentioned polymer or mixture (at about 60~150° C.) to form the overcoat layer on the metal nanowire layer 140A. The physical structure of the overcoat layer and the metal nanowire layer 140A is not limited in this disclosure. For example, the overcoat layer and the metal nanowire layer 140A can be two physically-stacked structures, or the overcoat layer and the metal nanowire layer 140A can be combined integrate to form a composite layer. In the embodiment, the metal nanowires 140 are embedded into the overcoat layer to form a composite structure, which can be patterned in the following process.

After the step of removing the first portion of the metal layer 120A on the touch sensing area VA, a second patterning process is performed to pattern the metal nanowire layer 140A on the touch sensing area VA for forming the touch sensing electrode TE, and also to pattern the metal layer 120A and the metal nanowire layer 140A on the peripheral area PA for forming the peripheral trace 120. As a result, the touch sensing panel 100 of this embodiment can be manufactured (as shown in FIG. 1). In the embodiment, the photosensitive material (e.g., a photoresist) is coated and treated by the exposure/developing process to define the pattern of the touch sensing electrode TE on the touch sensing area VA and the pattern of the peripheral trace 120 on the peripheral area PA (as known as the lithography process). Next, the etching process is performed to form the touch sensing electrode(s) TE by etching the metal nanowire layer 140A (i.e., the first portion of the metal nanowire layer 140A) on the touch sensing area VA (as shown in FIGS. 1 and 4B), and to form the peripheral trace(s) 120 by etching the metal nanowire layer 140A (i.e., the second portion of the metal nanowire layer 140A) and the metal layer 120A (i.e., the second portion of the metal layer 120A) on the peripheral area PA (as shown in FIGS. 1, 4A and 4B).

In one embodiment, the etchant/etching solution (the second etching solution) can etch the metal nanowire layer 140A and the metal layer 120A so as to form the touch sensing electrodes TE and the peripheral traces 120 in one process. Accordingly, the connection of the touch sensing electrode TE on the touch sensing area VA and the peripheral trace 120 on the peripheral area PA can be formed by utilizing the minimum times of the alignment process (e.g., one alignment process). This feature can prevent the decreased production yield caused by multiple alignment processes and save the alignment tolerance reserved for the alignment processes, thereby minimizing the width of the peripheral trace 120 so as to achieve the requirement of the narrow border display device.

In one specific embodiment, the metal nanowire layer 140A is a silver nanowire layer and the metal layer 120A is a copper layer, the etching solution can etch the copper layer and the silver layer. For example, the etching solution mainly contains $H_3PO_4$ (about 5 wt %~15 wt %) and $HNO_3$ (about 55 wt %~70 wt %) for removing the copper material and the silver material in one manufacturing process, and that means the etchant has similar etch rates to silver and copper materials. In another specific embodiment, the etching solution can be further added with an additive, such as an etching selectivity adjustor, for adjusting the etching rates for copper material and silver material. For example, the etching solution mainly containing $H_3PO_4$ (about 5 wt %~15 wt %) and $HNO_3$ (about 55 wt %~70 wt %) can be added with about 5 wt %~10 wt % of benzotriazole (BTA) for solving the over-etching issue for the copper material.

Figure 4A:
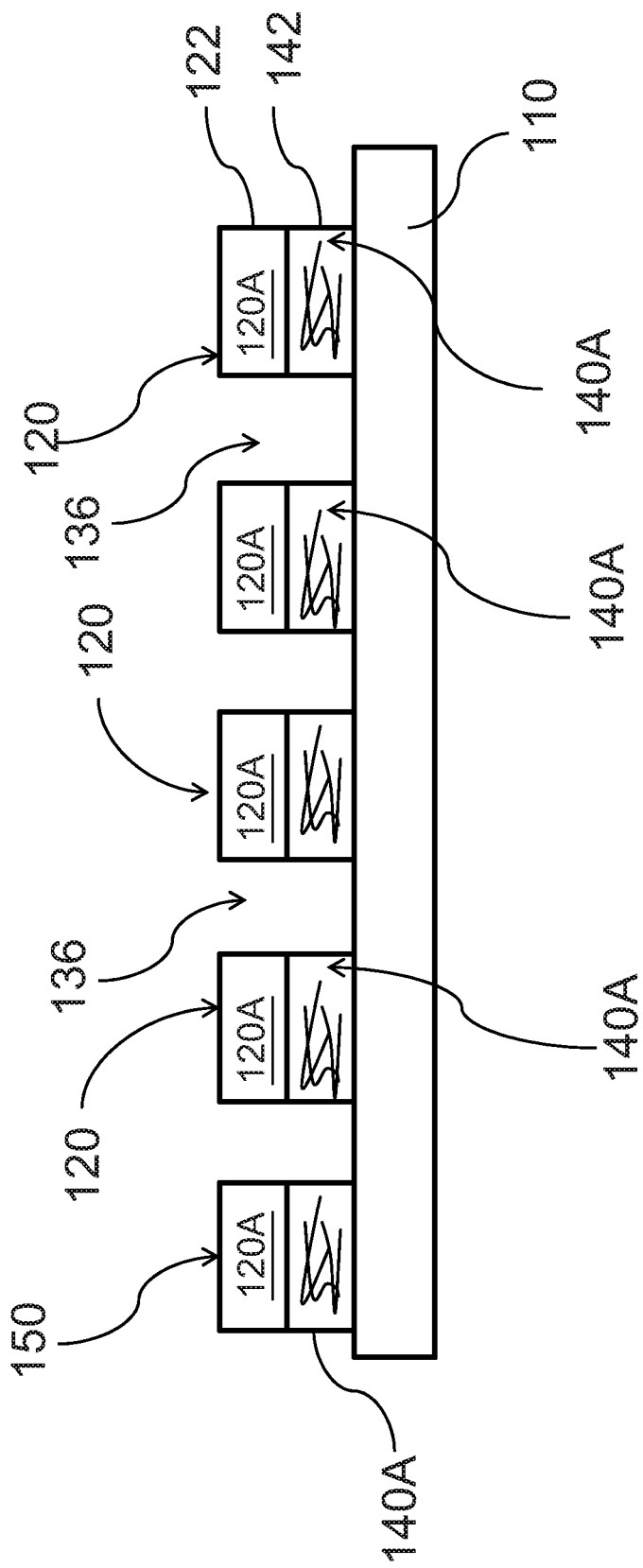
FIG. 4A is a sectional view of FIG. 1 along the line 4A-4A.
Figure 4B:
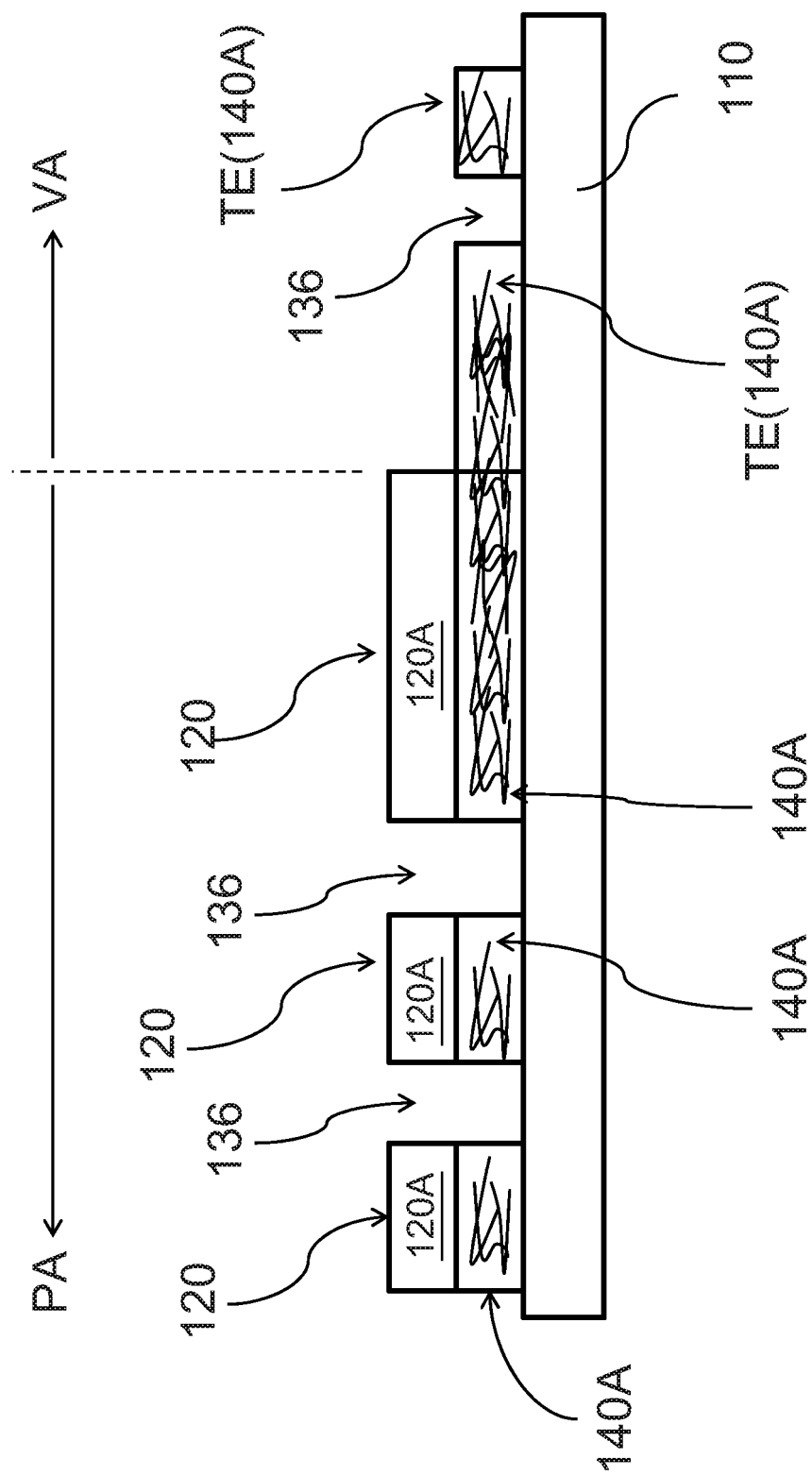
FIG. 4B is a sectional view of FIG. 1 along the line 4B-4B.

Referring to FIG. 1 in view of FIGS. 4A and 4B, the touch sensing panel 100 (as shown in FIG. 1) comprises a substrate 110, peripheral traces 120 including the metal layer 120A and the metal nanowire layer 140A, and touch sensing electrodes TE including the metal nanowire layer 140A. Each touch sensing electrode TE can be electrically connected with the corresponding peripheral trace 120, and the metal nanowire layer 140A comprises the metal nanowires 140 and the etching inhibitor. Since the etching inhibitor is incorporated in the first and second portions of the metal nanowire layer 140A, the touch sensing electrode TE comprises the etching inhibitor, and the peripheral trace 120 also comprises the etching inhibitor.

In more detailed, as shown in FIGS. 4A and 4B, in some embodiments of this disclosure, each peripheral trace 120 is a composite structure having two conductive structure layers, which comprise a metal layer 120A and a metal nanowire layer 140A disposed between the metal layer 120A and the substrate 110. The metal nanowire layer 140A is added with the etching inhibitor. For viewing a single peripheral trace 120, the metal layer 120A and the metal nanowire layer 140A have a co-planar etched surface. The touch sensing electrode TE is formed by patterning the metal nanowire layer 140A. That is, the metal nanowire layer 140A can form the touch sensing electrode TE on the touch sensing area VA, and form the lower layered structure of the peripheral trace 120 on the peripheral area PA. Accordingly, the touch sensing electrode TE and the corresponding peripheral trace 120 can be electrically connected with each other by the conductive metal nanowire layer 140A for performing the signal transmission.

As shown in FIGS. 4A and 4B, in the peripheral area PA, a non-conductive area 136 is formed between adjacent peripheral traces 120 for electrically isolating the adjacent peripheral traces 120, thereby preventing the undesired short circuit issue. That is, a non-conductive area 136 is formed between the first side walls 122 of the adjacent metal layers 120A and also between the second side walls 142 of the adjacent metal nanowire layers 140A. In this embodiment, the non-conductive area 136 is a gap for insulating the adjacent peripheral traces 120. In one embodiment, the gap can be formed by the above-mentioned etching process, so that the first side wall 122 and the second side wall 142 can be aligned with each other as a co-planar etched surface. In other words, the first side wall 122 and the second side wall 142 can be formed in a single etching process with the same etching solution. Alternatively, the first side wall 122 can be formed in one etching step, and the second side wall 142 can be formed in another etching step. In one embodiment, the second side wall 142 of the metal nanowire layer 140A does not contain metal nanowire after the above-mentioned etching step. Moreover, the metal layer 120A and the metal nanowire layer 140A can have the same or similar patterns or sizes. For example, the metal layer 120A and the metal nanowire layer 140A can both have a stripe or a straight pattern, and the widths thereof are the same or similar to each other.

As shown in FIG. 4B, in the touch sensing area VA, a non-conductive area 136 is formed between adjacent touch sensing electrodes TE for electrically isolating the adjacent touch sensing electrodes TE, thereby preventing the undesired short circuit issue. The non-conductive area 136 is formed between the side walls of the adjacent touch sensing electrodes TE. In this embodiment, the non-conductive area 136 is a gap for insulating the adjacent touch sensing electrodes TE. In one embodiment, the gap can be formed between the adjacent touch sensing electrodes TE by the above-mentioned etching process. In this embodiment, the touch sensing electrodes TE are disposed in a non-interlaced arrangement. For example, the touch sensing electrodes TE can be long-stripe electrodes extending along the first direction D1, and they are not interlaced with each other. In other embodiments, the touch sensing electrodes TE may have any proper shape, and this disclosure is not limited thereto. In this embodiment, the touch sensing electrodes TE have a single-layer structure, and the touch control position can be obtained by detecting the capacitance variation of each touch sensing electrode TE.

In this embodiment, the touch sensing electrode TE on the touch sensing area VA meets the requirement of electrical conductivity and light transmission for display applications. Accordingly, the material of the metal nanowire layer 140A for manufacturing the touch sensing electrode TE has the following properties. The light transmission for visible light (about 400 nm-700 nm) is greater than about 80%, and the surface resistance is between about 10 ohm/square and 1000 ohm/square. In another embodiment, the light transmission for visible light (about 400 nm-700 nm) of the metal nanowire layer 140A is greater than about 85%, and the surface resistance thereof is between about 50 ohm/square and 500 ohm/square.

In one embodiment, as shown in FIGS. 1 and 4A, at least one mark 150 is disposed on the peripheral area PA of the substrate 110. Similar to the peripheral trace 120, the mark 150 can be formed by one etching step of patterning the metal nanowire layer 140A and the metal layer 120A. Accordingly, the mark 150 also comprises the metal layer 120A and the metal nanowire layer 140A disposed between the metal layer 120A and the substrate 110, and the meta nanowire layer 140A is added with the etching inhibitor. In addition, the metal nanowire layer 140A and the metal layer 120A, in view of a single mark 150, have the same or similar patterns and sizes. For example, the metal nanowire layer 140A and the metal layer 120A of the mark 150 may be circles with the same or similar radius, rectangles with the same or similar lengths, or the same or similar patterns (e.g. crosses, L shapes, T shapes, or the likes). The mark 150 may be a configuration/structure/object without electrical function. For example, the mark 150 can be the inspection mark, pattern or label used in manufacturing processes, and this disclosure is not limited thereto. In addition, the mark 150 can be made as possible shapes, such as a circle, a rectangle, a cross, an L shape, a T shape, or the likes, and this disclosure is not limited thereto. In one embodiment, the two layers of the mark 150 have a co-planar etch-surface, as the peripheral trace 120.

Figure 6:
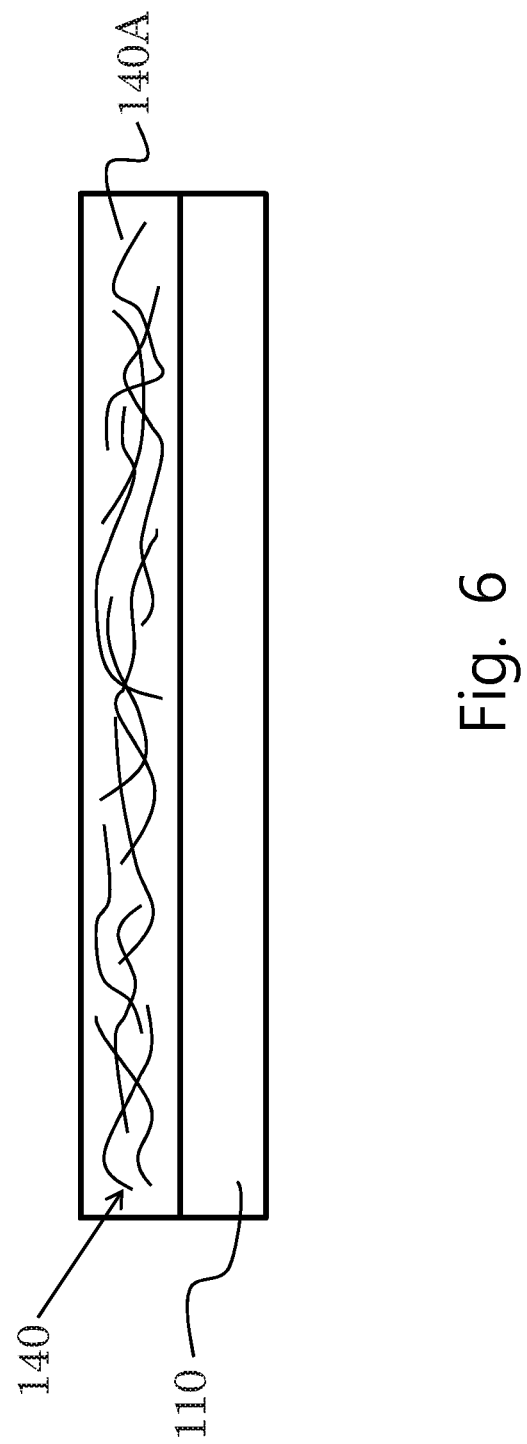
FIG. 6 is a schematic diagram showing the first step of the manufacturing method of the touch sensing panel according to some embodiments of this disclosure.

This disclosure also provides another manufacturing method of a touch sensing panel, which is different from the above embodiment at least in that the etching inhibitor is formed as a physical structure for protecting the touch sensing electrode TE on the touch sensing area VA from the etching solution. As shown in FIG. 6, firstly, a metal nanowire layer 140A is formed on a substrate 110, and the metal nanowire layer 140A can be at least made of metal nanowires 140. The description of the metal nanowire layer 140A can be referred to the above embodiment, so the details thereof will be omitted.

Next, an anti-etching layer 130, which is used as an etching-inhibition unit, is formed on the metal nanowire layer 140A. The anti-etching layer 130 is substantially formed on the touch sensing area VA. In more specific, the anti-etching layer 130 can be formed by a photoresist material for protecting the metal nanowire layer 140A from the following etching process. In one embodiment, the anti-etching layer 130 is formed on the touch sensing area VA for protecting the touch sensing electrode TE on the touch sensing area VA from the etching solution.

Figure 7:
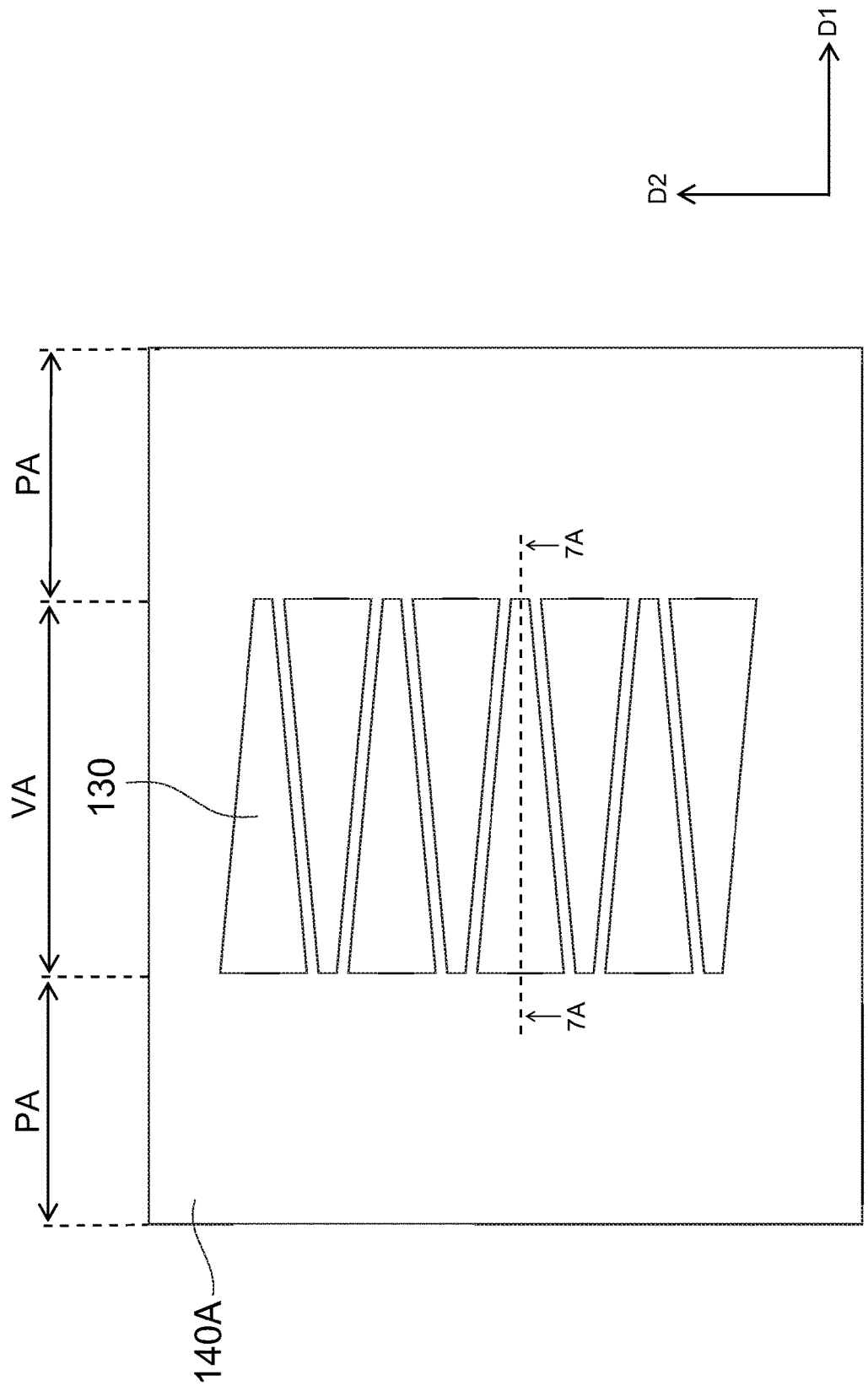
FIG. 7 is a schematic diagram showing the second step of the manufacturing method of the touch sensing panel according to some embodiments of this disclosure.
Figure 7A:
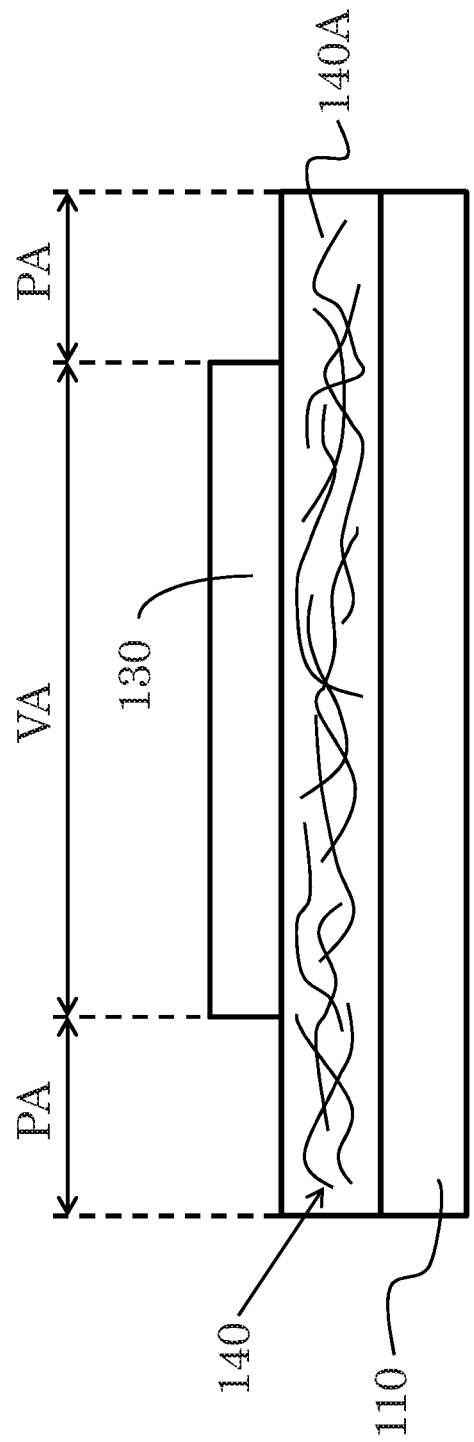
FIG. 7A is a sectional view of FIG. 7 along the line 7A-7A.

In one embodiment, the anti-etching layer 130 (also named as etching-inhibition layer) can have desired patterns for protecting the metal nanowire layer 140A from the following etching process and also transferring the pattern to the metal nanowire layer 140A. Specifically, as shown in FIGS. 7 and 7A, the photoresist material is coated on the metal nanowire layer 140A, and then the exposure/developing process is performed for patterning the photoresist material to form the patterned anti-etching layer 130, which covers the metal nanowire layer 140A. Preferably, the patterned anti-etching layer 130 is only formed on the first portion of the metal nanowire layer 140A on the touch sensing area VA. In other words, the anti-etching layer 130 on the peripheral area PA can be removed by the lithography process, thereby exposing the metal nanowire layer 140A on the peripheral area PA.

Figure 8:
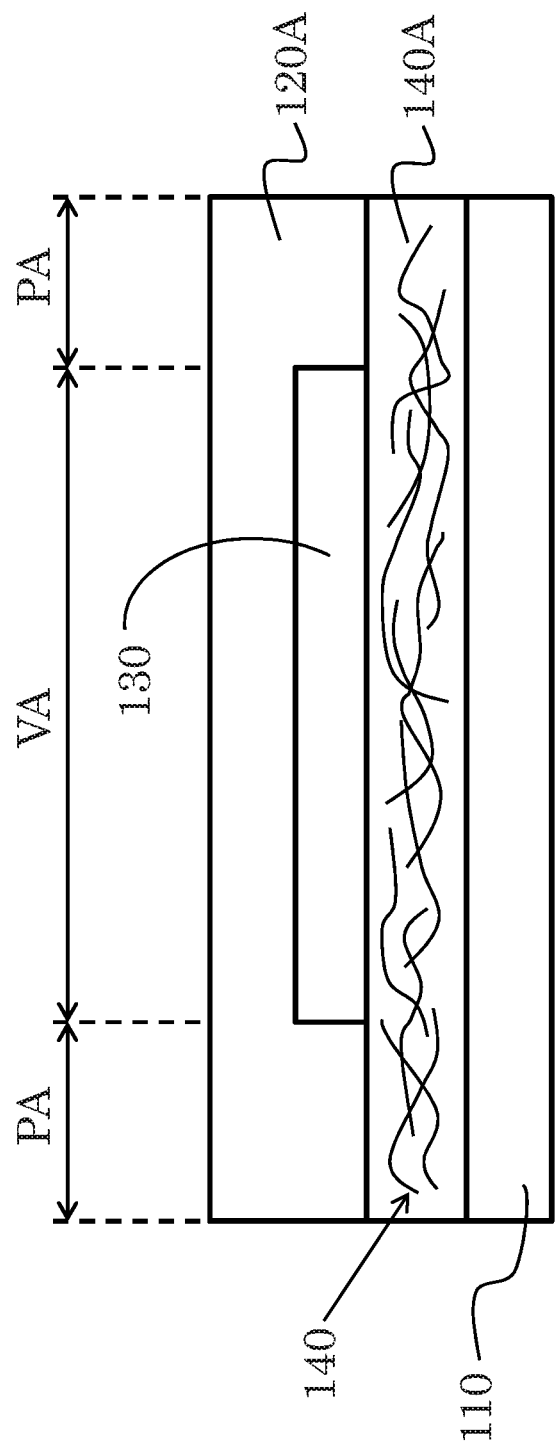
FIG. 8 is a schematic diagram showing the third step of the manufacturing method of the touch sensing panel according to some embodiments of this disclosure.

Next, the metal layer 120A is formed on the anti-etching layer 130 and the metal nanowire layer 140A as shown in FIG. 8. The manufacturing method of the metal layer 120A can be referred to the above embodiment, so the detailed description thereof will be omitted. In this step, since the metal nanowire layer 140 on the peripheral area PA is not covered by the anti-etching layer 130, the metal layer 120A is directly formed on and contact with the second portion of the metal nanowire layer 140A. Accordingly, the manufactured peripheral trace 120 is constructed by the stacked metal nanowire layer 140A and metal layer 120A, thereby forming the low-impedance signal transmission circuit.

Figure 9:
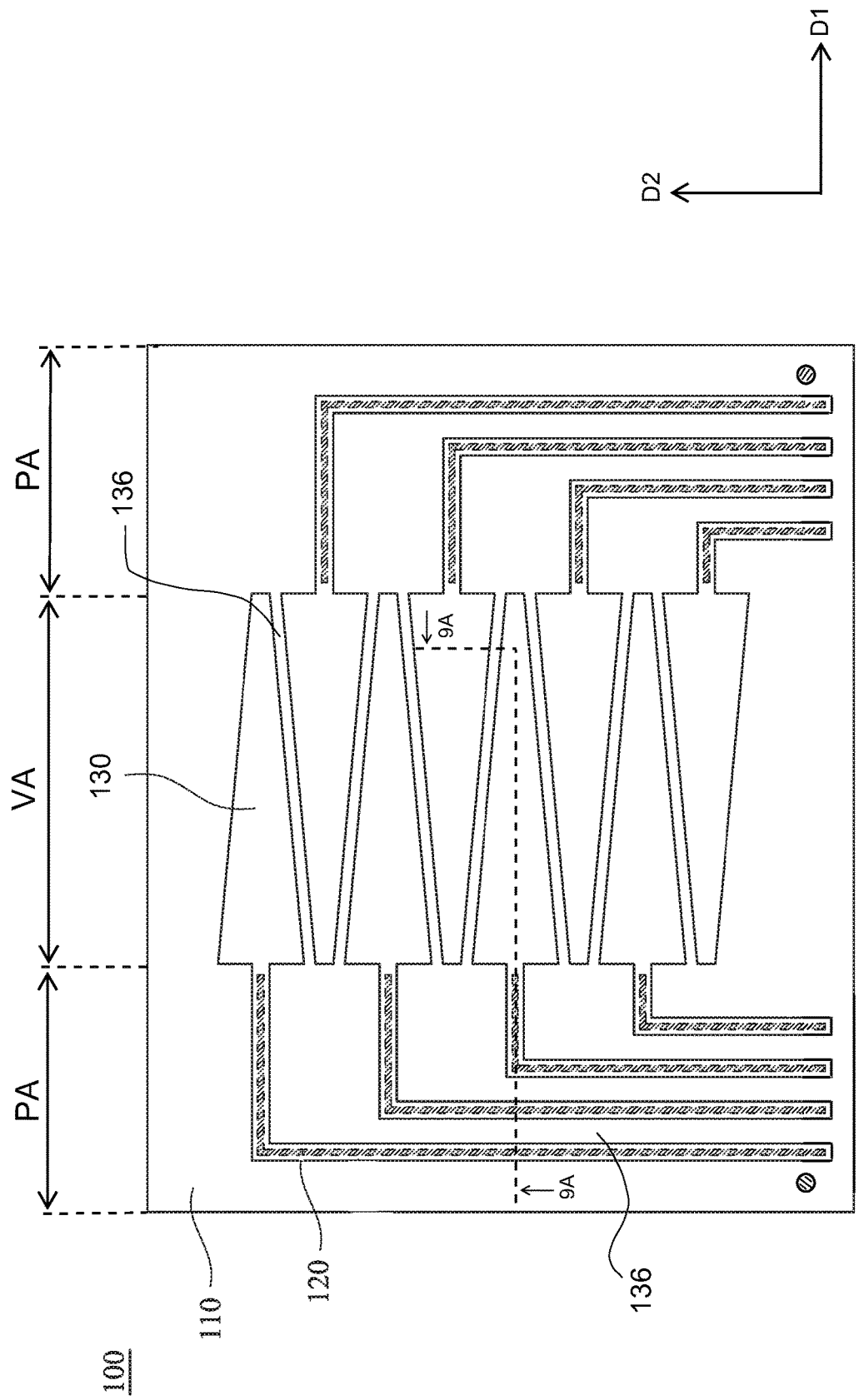
FIG. 9 is a schematic diagram showing the touch sensing panel according to some embodiments of this disclosure.
Figure 9A:
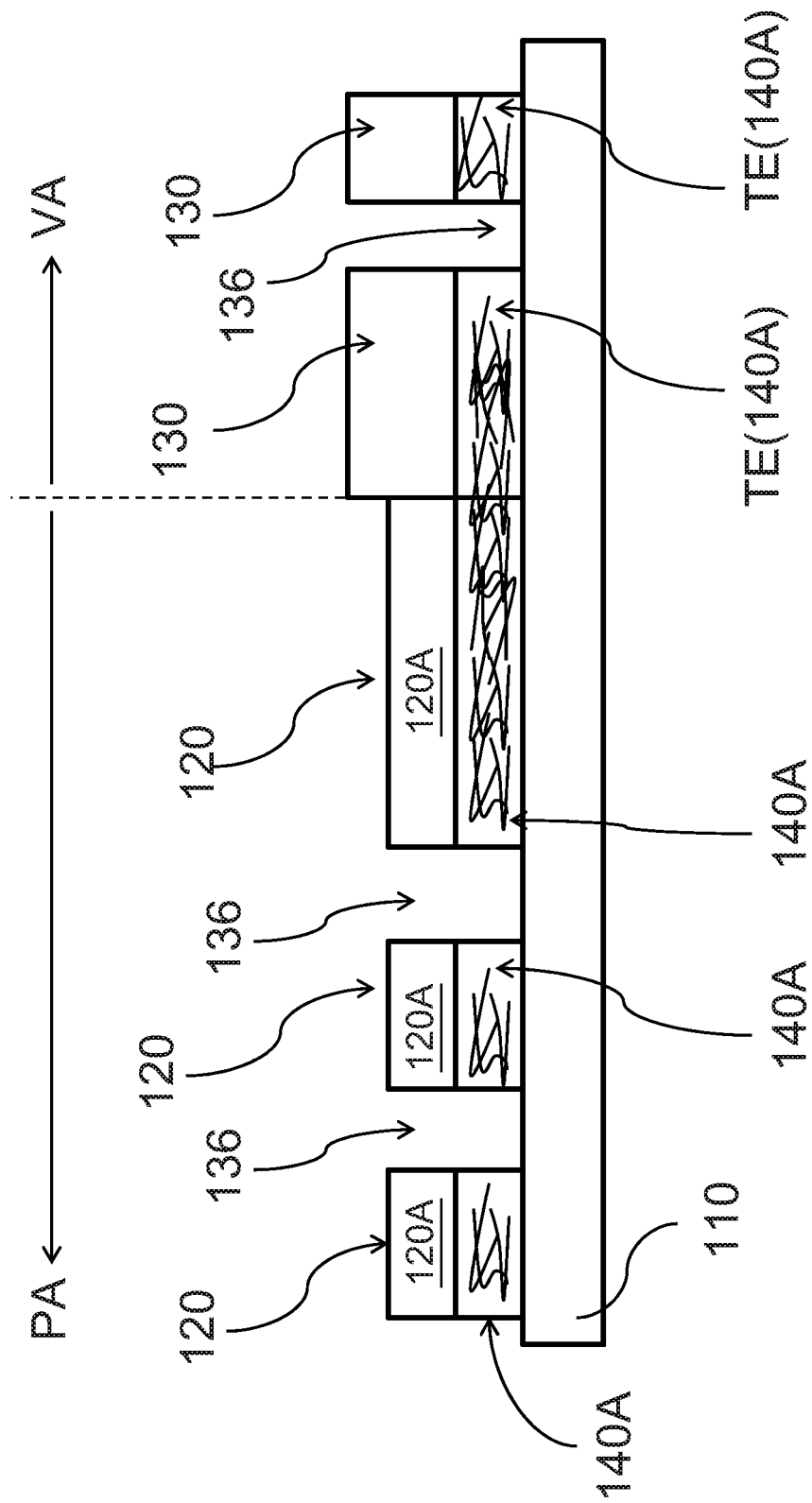
FIG. 9A is a sectional view of FIG. 9 along the line 9A-9A.

Afterwards, as shown in FIGS. 9 and 9A, the patterning process is performed for patterning the metal nanowire layer 140A and the metal layer 120A on the touch sensing area VA to form the touch sensing electrodes TE, and patterning the metal nanowire layer 140A and the metal layer 120A on the peripheral area PA to form the peripheral traces 120. In practice, the photosensitive material (e.g., a photoresist) is formed on the metal layer 120A on the peripheral area PA and is treated by the exposure/developing process (as known as the lithography process) to define the pattern of the peripheral trace 120 on the peripheral area PA. Next, the etching process is performed. In the touch sensing area VA, the metal layer 120A (i.e., the first portion of the metal layer 120A) is substantially removed by the etchant, and then the metal nanowire layer 140A is patterned to form the touch sensing electrode TE based the pattern of the anti-etching layer 130. Accordingly, the touch sensing electrode TE having the metal nanowire layer 140A on the touch sensing area VA is formed, and the anti-etching layer 130 is remained on the touch sensing electrode TE. In the peripheral area PA, the metal nanowire layer 140A and the metal layer 120A on the peripheral area PA is patterned by the etchant to form the peripheral traces 120. In other words, since the anti-etching layer 130 has the functions of resisting the etching solution and transferring the pattern, the two etching steps for the metal layer 120A on the touch sensing area VA in the previous embodiment can be performed in one etching step in this embodiment with an etching solution for two materials.

In one embodiment, the etching solution used in the patterning process can etch the metal nanowire layer 140A and the metal layer 120A simultaneously so as to form the touch sensing electrode TE and the peripheral trace 120 in one process. Accordingly, the connection of the touch sensing electrode TE on the touch sensing area VA and the peripheral trace 120 on the peripheral area PA can be formed by utilizing the minimum times of alignment process (e.g., one alignment process). This feature can prevent the decreased production yield caused by multiple alignment processes and save the alignment tolerance reserved for the alignment processes, thereby minimizing the width of the peripheral trace 120 so as to achieve the requirement of the narrow border display device.

In one specific embodiment, the metal nanowire layer 140A is a silver nanowire layer and the metal layer 120A is a copper layer, the etching solution can optionally etch the copper layer and the silver layer. For example, the etching solution mainly contains $H_3PO_4$ (5%~15%) and $HNO_3$ (55%~70%). In another specific embodiment, the etching solution can be further added with an additive, such as an etching selectivity adjustor, for adjusting the etching speeds for copper material and silver material. For example, the etching solution mainly containing $H_3PO_4$ (5%~15%) and $HNO_3$ (55%~70%) can be added with 5%~10% of benzotriazole (BTA) for solving the over-etching issue of the copper material.

Accordingly, as shown in FIG. 9, the touch sensing panel 100 of this embodiment can be manufactured. Referring to FIG. 9A, the touch sensing panel 100 comprises a substrate 110, a peripheral trace 120 including the metal layer 120A and the metal nanowire layer 140A, and a touch sensing electrode TE including the metal nanowire layer 140A. The touch sensing electrode TE can be electrically connected with the peripheral trace 120, and the etching-inhibition unit comprises the anti-etching layer 130 formed on the touch sensing electrode TE. In other words, the function of the added etching inhibitor in the touch sensing electrode TE in the previous embodiment is performed by the physical anti-etching layer 130 on the metal nanowire layer 140A in this embodiment for protecting the touch sensing electrode TE from the etching solution.

In one embodiment, the anti-etching layer 130 and the touch sensing electrode TE have the same or similar patterns and sizes.

Figure 10:
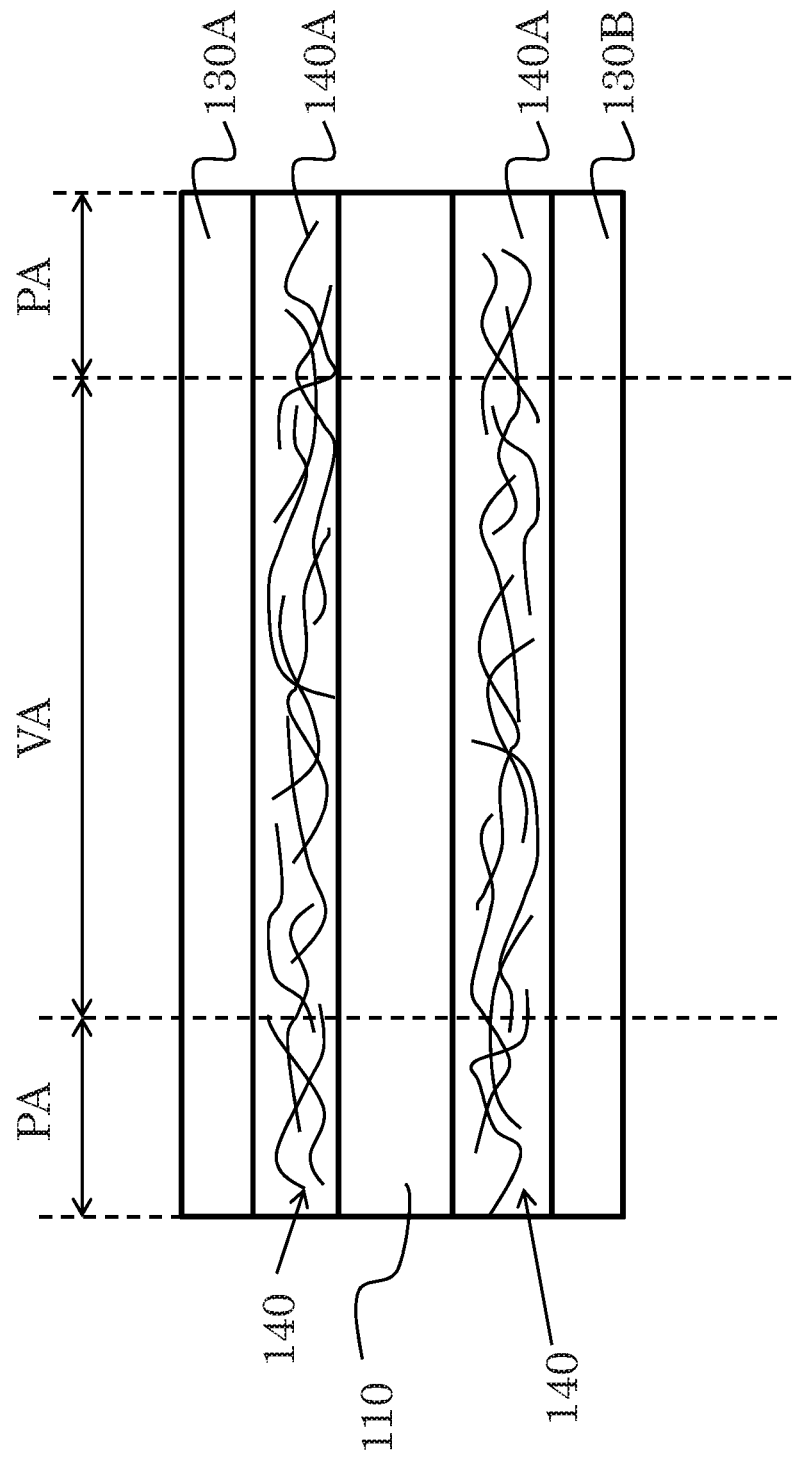
FIG. 10 is a schematic diagram showing the first step of the manufacturing method of the touch sensing panel according to some embodiments of this disclosure.

This disclosure also provides another manufacturing method of a double-sided touch sensing module. As shown in FIG. 10, the metal nanowire layer 140A and the anti-etching layer 130 are formed on the first surface (e.g., the upper surface) of the substrate 110 and also on the second surface (e.g., the lower surface) of the substrate 110. The steps for forming the metal nanowire layer 140A and the anti-etching layer 130 can be referred to the above embodiments, so the detailed description thereof will be omitted. The anti-etching layer 130 on the upper surface of the substrate 110 is named as a first anti-etching layer 130A, and the anti-etching layer 130 on the lower surface of the substrate 110 is named as a second anti-etching layer 130B in the following description.

Figure 11:
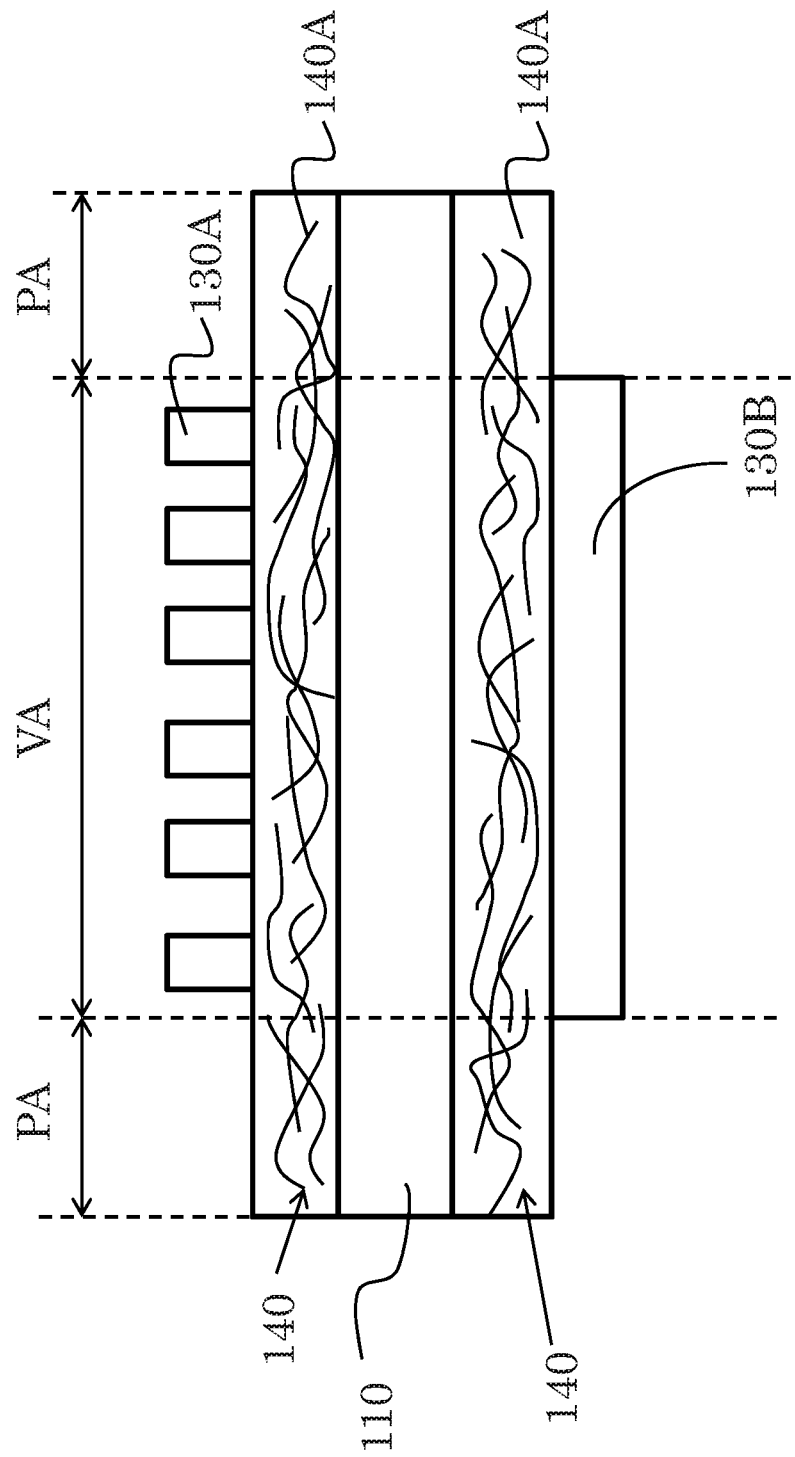
FIG. 11 is a schematic diagram showing the second step of the manufacturing method of the touch sensing panel according to some embodiments of this disclosure.

Next, the first anti-etching layer 130A and the second anti-etching layer 130B are patterned for protecting the metal nanowire layers 140A from the following etching process and also for transferring the pattern to the metal nanowire layers 140A. Specifically, the photoresist material is coated on the metal nanowire layers 140A on the upper and lower surfaces of the substrate 110, and then the double-sided exposure/developing process is performed for patterning the photoresist material to form the patterned first and second anti-etching layers 130A/130B, which respectively cover the metal nanowire layers 140A on the upper and lower surfaces (as shown in FIG. 11). In the embodiment, the first anti-etching layer 130A and the second anti-etching layer 130B only cover the metal nanowire layers 140A on the touch sensing area VA, so that the anti-etching layers 130 on the peripheral area PA can be removed by the lithography process, thereby exposing the metal nanowire layers 140A on the peripheral area PA.

This embodiment utilizes a double-sided lithography process to pattern the first anti-etching layer 130A and the second anti-etching layer 130B. In more detailed, a double-sided exposure process is performed to define remaining areas and removing areas on the first anti-etching layer 130A and the second anti-etching layer 130B. Next, a double-sided developing process is performed to remove the removing areas of the first anti-etching layer 130A and the second anti-etching layer 130B, thereby patterning the first anti-etching layer 130A and the second anti-etching layer 130B.

The first anti-etching layer 130A and the second anti-etching layer 130B can be treated with the exposure process simultaneously or sequentially. In practice, the above-mentioned double-sided exposure step can adopt two light sources for performing the exposure process to the first anti-etching layer 130A and the second anti-etching layer 130B, respectively. The light sources (e.g., UV light sources) can transfer the patterns of the masks onto the first anti-etching layer 130A and the second anti-etching layer 130B, thereby defining the above-mentioned removing areas and the remaining areas. For example but not limited to, the following solution can be used to prevent the interference between the two light sources.

Two light sources (e.g., a first light source and a second light source) are disposed above and below the substrate 110, respectively, and the two light sources emit lights with the same wavelengths or in a similar wavelength range. For example, the two light sources can be G-line UV light sources or I-line UV light sources. The first anti-etching layer 130A and the second anti-etching layer 130B are made of the photoresists having the corresponding wavelength absorption properties. The first anti-etching layer 130A and the second anti-etching layer 130B are made of the photoresists having light sensitivity to the light in similar or the same wavelength or wavelength range. For example, the photoresists for the first anti-etching layer 130A and the second anti-etching layer 130B are both sensitive to G-line UV light or I-line UV light. In addition, a light absorption material (about 0.1%~10% by weight) is added into the photoresist. For example, the UV absorber can be added into the first anti-etching layer 130A and the second anti-etching layer 130B with respect to the UV light sources. Accordingly, when the upper light source irradiates light onto the first anti-etching layer 130A, the energy of the light emitted from the upper light source can be sufficiently absorbed by the first anti-etching layer 130A (e.g., greater than about 80%), and the light emitted from the upper light source will not affect the second anti-etching layer 130B. Similarly, when the lower light source irradiates light to expose the second anti-etching layer 130B, the energy of the light emitted from the lower light source can be sufficiently absorbed by the second anti-etching layer 130B (e.g., greater than about 80%), and the light emitted from the lower light source will not affect the first anti-etching layer 130A. Therefore, the first anti-etching layer 130A and the second anti-etching layer 130B can be treated by the exposure process at the same time, and the patterning results thereof are not interfered. For example, when the I-line UV light sources are selected to perform the above-mentioned double-sided exposure process, the major UV absorption additives of the first anti-etching layer 130A and the second anti-etching layer 130B comprise Octyl-3-[3-tert-butyl-4-hydroxy-5-(5-chloro-2H-benzotriazole-2-yl)phenyl]propionate and 2-Ethylhexyl-3-[3-tert-butyl-4-hydroxy-5-(5-chloro-2H-benzotriazole-2-yl)phenyl]propionate, and the chemical formula thereof is:

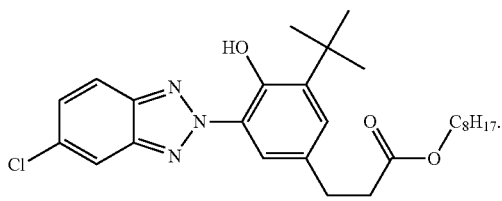

Accordingly, the light transmittance of the I-line UV light with respect to the anti-etching layers is lower than about 30%, or lower than about 20%, or lower than about 10%, or lower than about 5%. In this embodiment, the concentration of the UV light absorption additive is about 1%~3% by weight or by volume, or about 3% by weight or by volume, or about 2% by weight or by volume, or about 1% by weight or by volume.

In one modified embodiment, the light sources having the same wavelength are disposed above and below the substrate 110, respectively, and the selected photoresist for manufacturing the first anti-etching layer 130A and the second anti-etching layer 130B has a high absorption of UV light (e.g., greater than 80% of the total energy of the UV light), thereby preventing the interference between the exposures of the first anti-etching layer 130A and the second anti-etching layer 130B. In another modified embodiment, the parameters of the upper and lower light sources (e.g., the power, energy, etc.) can be adjusted so as to prevent the interference between the exposures of the first anti-etching layer 130A and the second anti-etching layer 130B.

In one modified embodiment, the double-sided exposure step may provide the light sources having different wavelengths above and below the substrate 110, respectively. For example, one light source is a G-line UV light source, and the other light source is an I-line UV light source. The photoresists of the first anti-etching layer 130A and the second anti-etching layer 130B have the absorption properties corresponding to the wavelengths of the lights emitted from the two light sources, respectively. In other words, the two photoresists are sensitive with lights in different wavelength ranges. For example, one photoresist is sensitive to the light emitted from G-line UV light source, and the other photoresist is sensitive to I-line UV light source. Accordingly, the chemical reactions of the first anti-etching layer 130A and the second anti-etching layer 130B can be induced by the light sources having different wavelengths, thereby preventing the interference between the exposures of the first anti-etching layer 130A and the second anti-etching layer 130B. In addition, this embodiment can also utilize the above-mentioned light absorption additives, and the detailed descriptions thereof will be omitted.

After the above-mentioned double-sided exposure step, a double-sided developing step is performed. In the double-sided developing step, the developing solution is provided to develop the first anti-etching layer 130A and the second anti-etching layer 130B so as to pattern the first anti-etching layer 130A and the second anti-etching layer 130B. In one embodiment, the first anti-etching layer 130A and the second anti-etching layer 130B are made of the negative-type photo-sensitive photoresist, so that the removing areas are defined by the non-exposure region, and the remaining areas are defined by the exposure region. A proper developing solution can be provided to remove the parts of the first anti-etching layer 130A and the second anti-etching layer 130B within the removing areas. In practice, the developing solution comprises tetramethylammonium hydroxide (TMAH), xylene ($C_6H_4(CH_3)_2$), butyl acetate or aromatic hydrocarbon solvent for removing the parts of the first anti-etching layer 130A and the second anti-etching layer 130B within the removing areas. In one embodiment, the first anti-etching layer 130A and the second anti-etching layer 130B are made of positive-type photo-sensitive photoresist, so that the removing areas are defined by the exposure region, and the remaining areas are defined by the non-exposure region. A proper developing solution can be provided to remove the parts of the first photo-sensitive layer 120A and the second photo-sensitive layer 120B within the removing areas 130B. In practice, the developing solution comprises alkaline solution (e.g. KOH, $Na_2CO_3$) for removing the parts of the first anti-etching layer 130A and the second anti-etching layer 130B within the removing areas.

Since the first anti-etching layer 130A and the second anti-etching layer 130B have the same photo sensitivity, the above-mentioned developing process can be a double-sided process.

In one embodiment, the first anti-etching layer 130A and the second anti-etching layer 130B can be made of different photoresists with different photo sensitivities (e.g., one is a negative-type photoresist and the other one is a positive-type photoresist).

Figure 12:
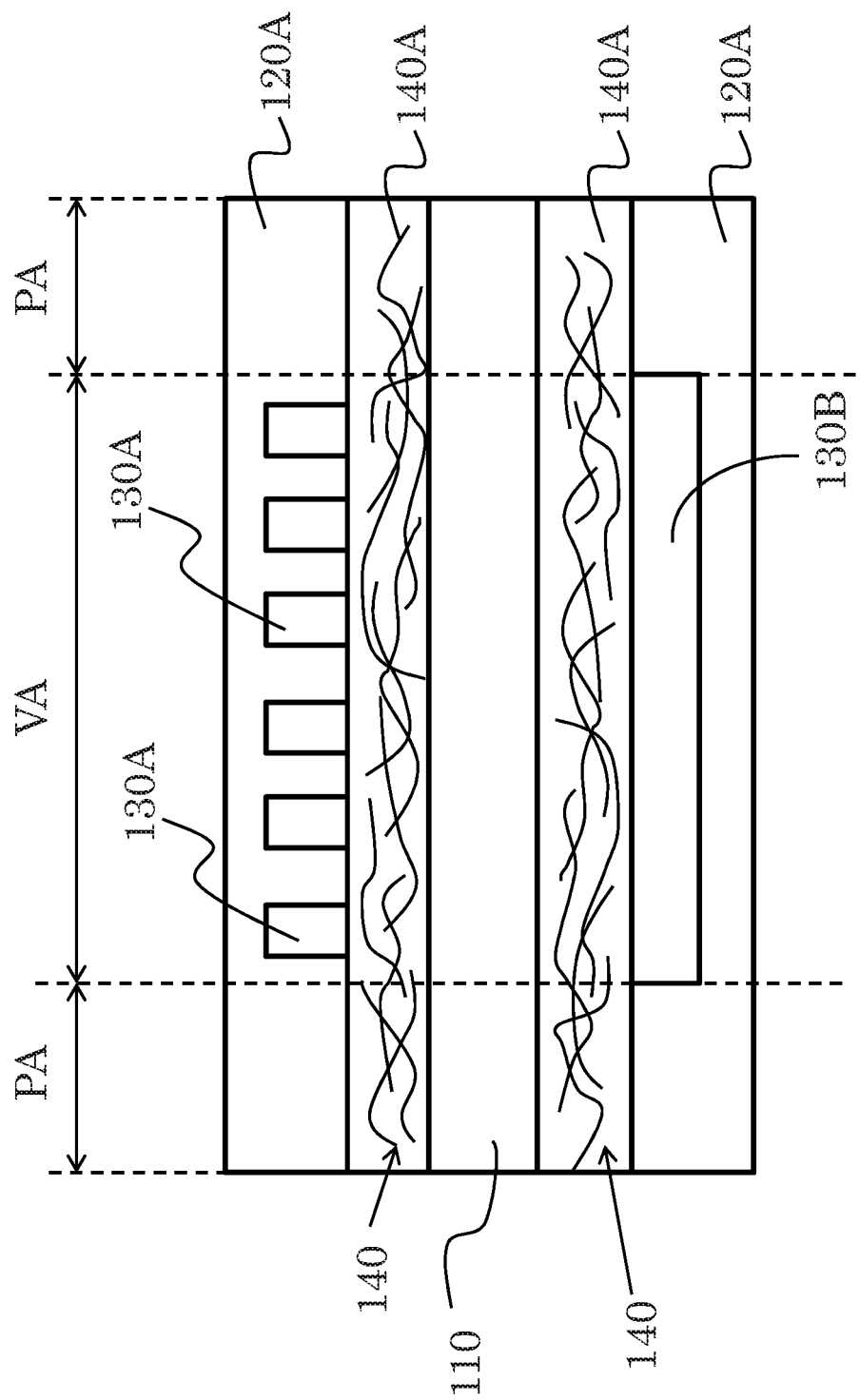
FIG. 12 is a schematic diagram showing the third step of the manufacturing method of the touch sensing panel according to some embodiments of this disclosure.

Next, as shown in FIG. 12, the metal layers 120A are formed on two sides of the substrate 110.

Afterwards, the patterning process is performed. In practice, the photosensitive material (e.g., photoresist) is formed on the metal layers 120A and is then treated by the exposure/developing process (as known as the double-sided lithography process) to define the patterns of the peripheral traces 120 on the peripheral areas PA. Next, the etching solution, which can simultaneously etch the metal nanowire layers 140A and the metal layers 120A, is provided to perform the etching process (referring to the related descriptions of the previous embodiments) to form the first touch sensing electrode TE1 and the second touch sensing electrode TE2 on the touch sensing areas VA, and to form the peripheral traces 120 on the peripheral areas PA on both sides of the substrate 110. The first anti-etching layer 130A and the second anti-etching layer 130B are formed on the first touch sensing electrode TE1 and the second touch sensing electrode TE2, respectively. The manufacturing steps of the above process can be referred to the above embodiments, so the detailed descriptions thereof will be omitted.

As shown in the sectional view of FIG. 13A, as viewing from the top surface of the substrate 110, the etching reaction can be described in details as below. In the touch sensing area VA, the metal layer 120A is etched or removed by the etching solution, and then the metal nanowire layer 140A is etched based on the pattern of the first anti-etching layer 130A so that the metal nanowire layer 140A is patterned as the first touch sensing electrodes TEL In addition, the first anti-etching layer 130A is located on the remained metal nanowire layer 140A (i.e., the first touch sensing electrodes TE1). At the same time, in the peripheral area PA, the metal layer 120A and the metal nanowire layer 140A in the peripheral area PA are also etched by the etchant with another patterned photoresist on the second portion of the metal layer 120A to form the peripheral traces 120, and each peripheral trace 120 is connected with the corresponding first touch sensing electrode TEL In one embodiment, the first touch sensing electrode TE1 is substantially disposed in the touch sensing area VA and comprises a plurality of linear or straight sensing electrodes extending along one direction (e.g., the first direction D1). The removing areas can be defined as non-conductive areas 136 for electrically isolating the adjacent sensing electrodes. The first anti-etching layer 130A is formed on each sensing electrode for blocking the metal nanowire layer 140A from the etching solution. The first touch sensing electrode TE1 and the first anti-etching layer 130A have corresponding patterns. In one embodiment, the first touch sensing electrode TE1 and the first anti-etching layer 130A substantially have the same patterns (e.g., the above-mentioned linear or straight shape), and the first touch sensing electrode TE1 and the first anti-etching layer 130A have aligned side walls or side surfaces. In other words, the corresponding aligned side walls of the first touch sensing electrode TE1 and the first anti-etching layer 130A form a co-planar etch-surface.

Similarly, as shown in the sectional view of FIG. 13B, as viewing from the bottom surface of the substrate 110, the etching reaction can be described in details as below. In the touch sensing area VA, the metal layer 120A is etched or removed by the etching solution, and then the metal nanowire layer 140A is etched based on the pattern of the second anti-etching layer 130B so as to pattern the metal nanowire layer 140A for forming the second touch sensing electrodes TE2. At the same time, in the peripheral area PA, the metal layer 120A and the metal nanowire layer 140A in the peripheral area PA are also etched by the etchant with another patterned photoresist on the second portion of the metal layer 120A to form the peripheral traces 120, and each peripheral trace 120 is connected with the corresponding second touch sensing electrode TE2. In one embodiment, the second touch sensing electrode TE2 is substantially disposed in the touch sensing area VA and comprises a plurality of linear or straight sensing electrodes extending along one direction (e.g., the second direction D2). The removing areas can be defined as non-conductive areas 136 for electrically isolating the adjacent sensing electrodes. The second anti-etching layer 130B is formed on each sensing electrode for blocking the metal nanowire layer 140A from the etching solution. The second touch sensing electrode TE2 and the second anti-etching layer 130B have corresponding patterns. In one embodiment, the second touch sensing electrode TE2 and the second anti-etching layer 130B substantially have the same patterns (e.g., the above-mentioned linear or straight shape), and the second touch sensing electrode TE2 and the second anti-etching layer 130B have aligned walls or side surfaces. In other words, the corresponding side walls of the second touch sensing electrode TE2 and the first anti-etching layer 130A form a co-planar etch-surface.

The first touch sensing electrode TE1 and the second touch sensing electrode TE2 are interlaced with each other, and they can together construct the touch sensing electrode TE for sensing the touches or control gestures on the device.

Figure 13:
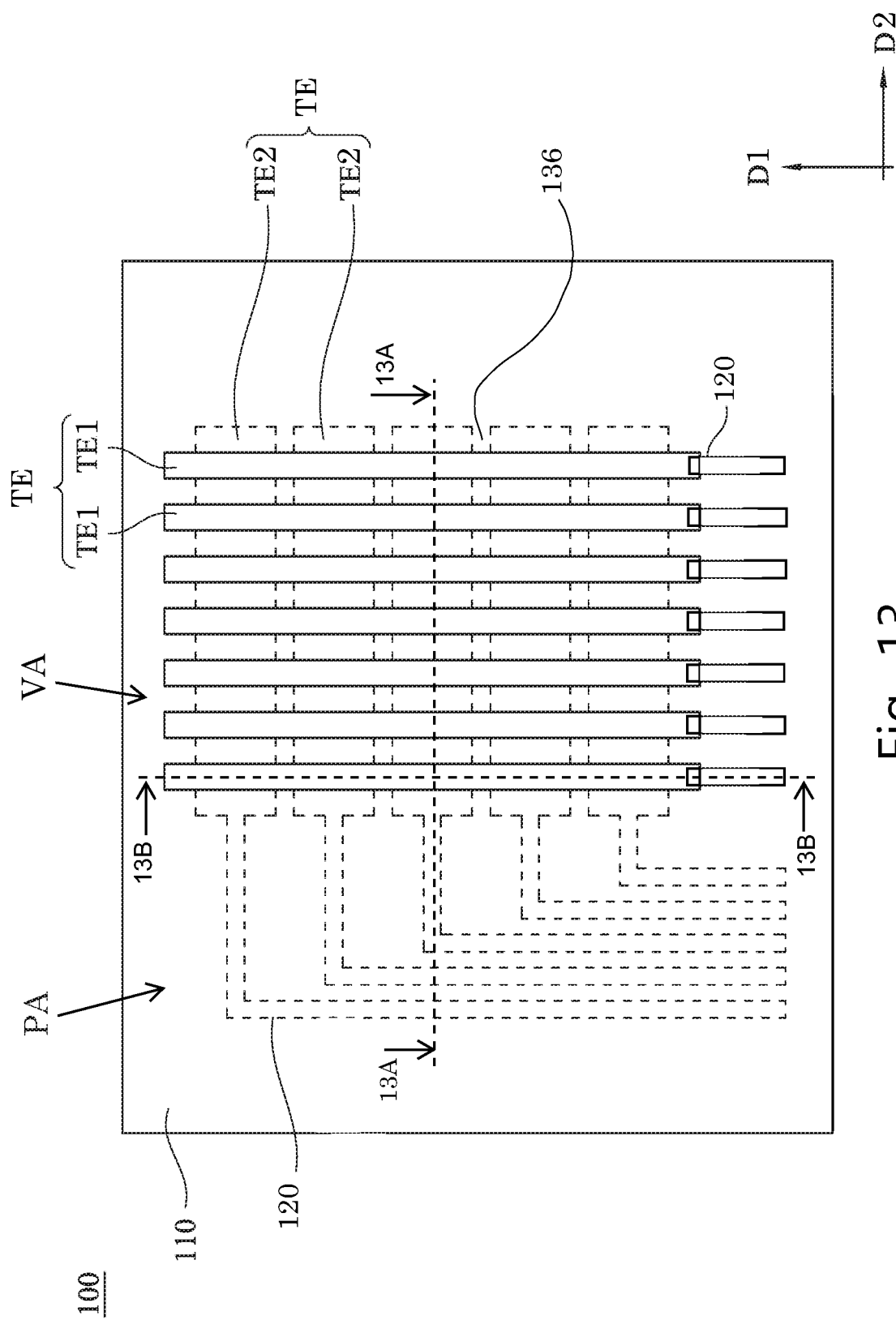
FIG. 13 is a schematic diagram showing the touch sensing panel according to some embodiments of this disclosure.
Figure 13A:
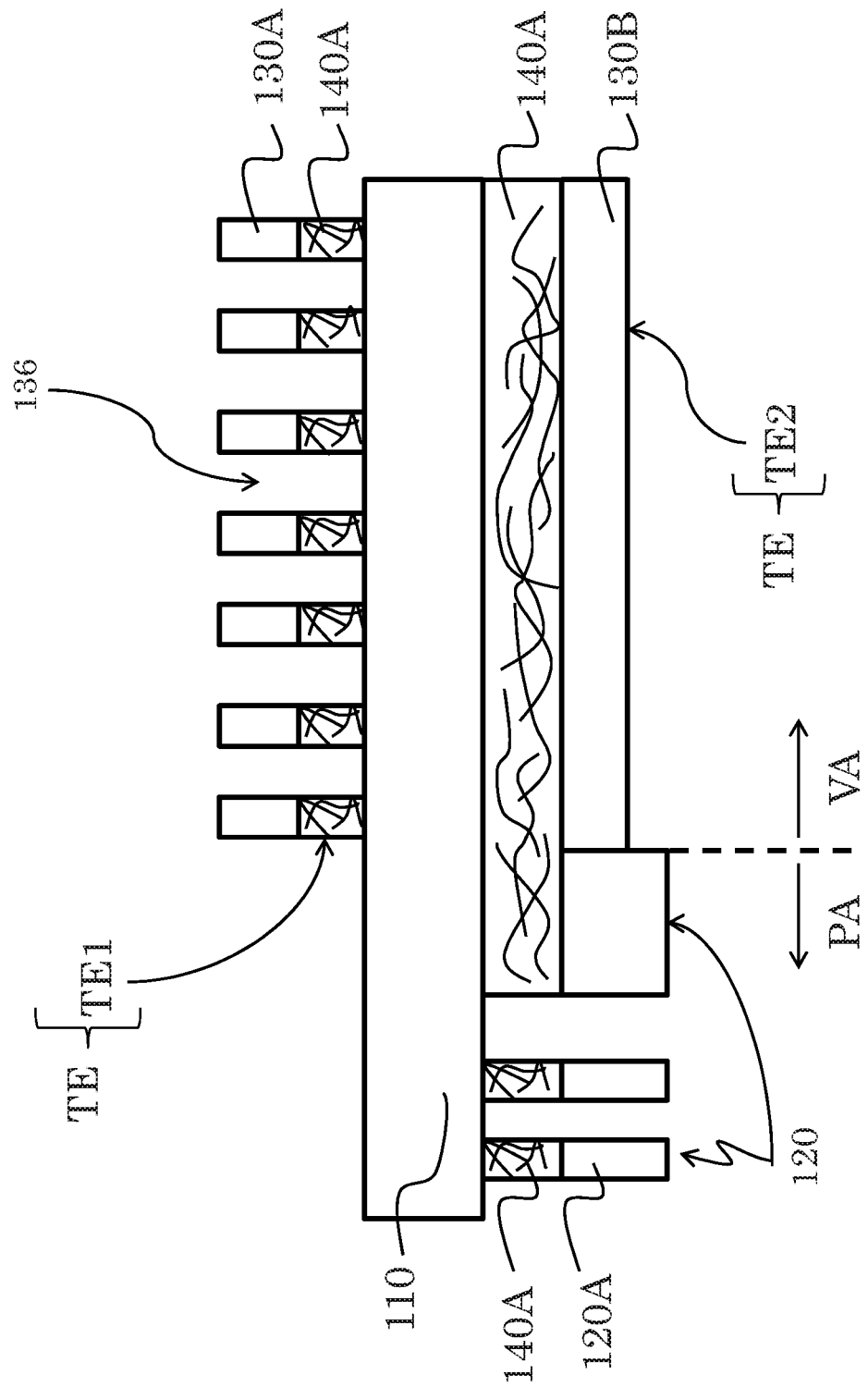
FIG. 13A is a sectional view of FIG. 13 along the line 13A-13A.

Accordingly, as shown in FIG. 13, the touch sensing panel 100 of this embodiment can be manufactured. Referring to FIG. 13, the touch sensing panel 100 comprises a substrate 110, a touch sensing electrode TE formed on the upper and lower surfaces of the substrate 110 (i.e., the first touch sensing electrode TE1 and the second touch sensing electrode TE2 formed by the metal nanowires 140), and peripheral traces 120 formed on the upper and lower surfaces of the substrate 110. As viewing from the upper surface of the substrate 110, the first touch sensing electrode TE1 of touch sensing electrode TE on the touch sensing area VA and the peripheral traces 120 on the peripheral area PA electrically connect with each other for transmitting signals. Similarly, as viewing from the lower surface of the substrate 110, the second touch sensing electrode TE2 of touch sensing electrode TE on the touch sensing area VA and the peripheral traces 120 on the peripheral area PA electrically connect with each other for transmitting signals. The peripheral traces 120 on both sides of the substrate 110 include the metal layer 120A and the metal nanowire layer 140A. In addition, the first touch sensing electrode TE1 and the second touch sensing electrode TE2 are covered by the first anti-etching layer 130A and the second anti-etching layer 130B, respectively. In other words, in this embodiment, the first anti-etching layer 130A and the second anti-etching layer 130B are physically formed on the upper and lower surfaces of the substrate 110 for respectively protecting the first touch sensing electrode TE1 and the second touch sensing electrode TE2 from the etch/corrosion of the etching solution during the double-sided manufacturing processes. Moreover, the first anti-etching layer 130A and the second anti-etching layer 130B are patterned so that they can be used as etch masks for the patterning process of the metal nanowire layers 140A on the upper and lower surfaces of the substrate 110.

Figure 13B:
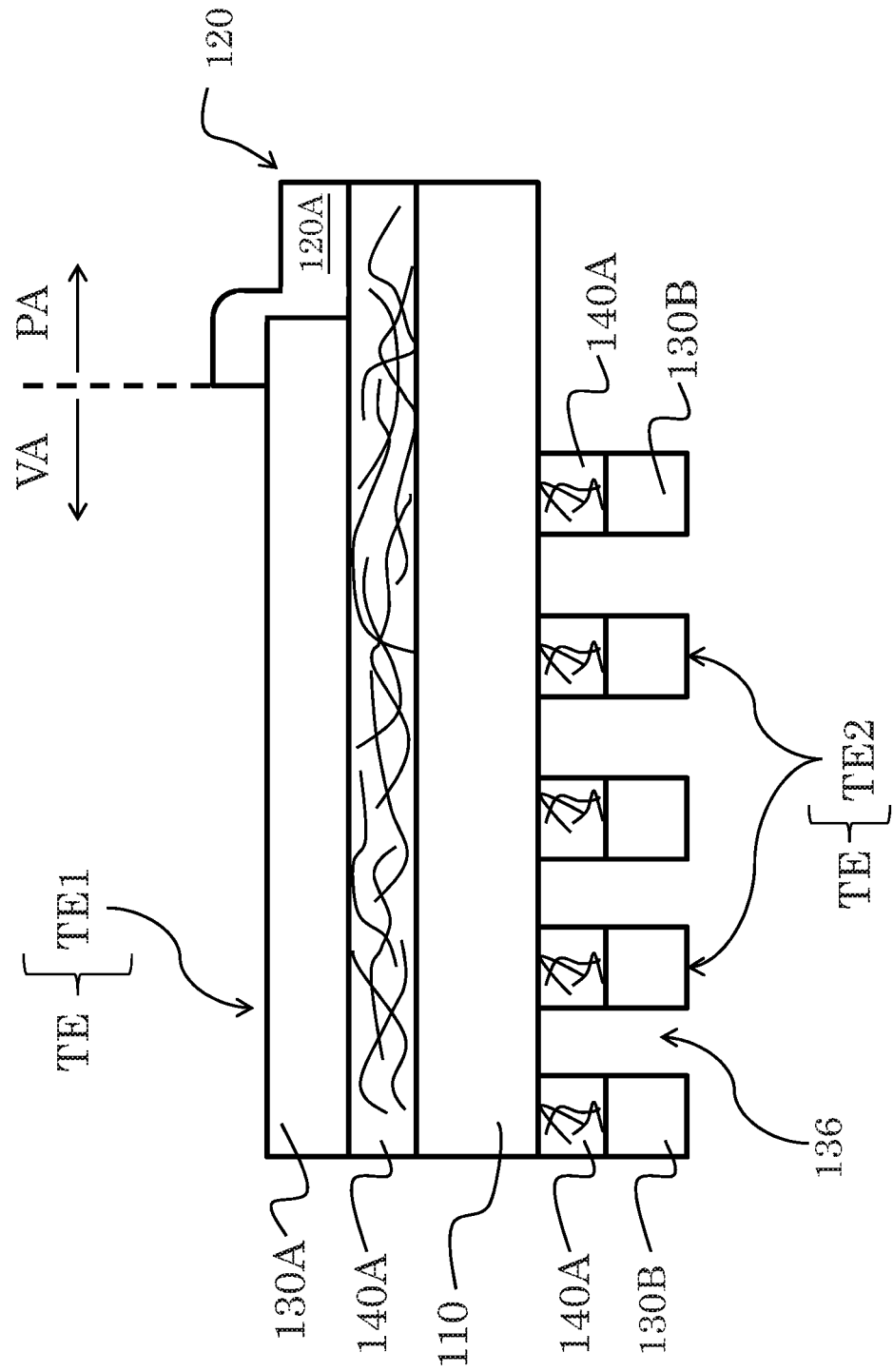
FIG. 13B is a sectional view of FIG. 13 along the line 13B-13B.

In one embodiment, as shown in FIG. 13B, the peripheral traces 120 are substantially disposed on the peripheral area PA, and a part of the metal layer 120A of the peripheral trace 120 climbs on the first anti-etching layer 130A.

In one embodiment, the first anti-etching layer 130A and the second anti-etching layer 130B are patterned photoresist materials, which are substantially formed on the touch sensing area VA but not on the peripheral area PA. Accordingly, the metal nanowire layer 140A on the peripheral area PA on either side of the substrate 110 can be exposed from the first anti-etching layer 130A or the second anti-etching layer 130B, so that the metal nanowire layer 140A on the peripheral area PA can directly contact with the exposed metal layer 120A, thereby providing signal transmission paths with low impedance or low resistance.

In one embodiment, a post-treatment of the metal nanowires 140 can be performed. The post-treatment may increase the conductivity thereof. The post-treatment may comprise the process of heating, plasma, corona discharge, UV ozone or pressure. For example, after the step of drying/curing the metal nanowire layer 140A, a roller is provided to press the metal nanowire layer 140A. In one embodiment, one or more rollers are provided to press the metal nanowire layer 140A with a pressure of about 50-3400 psi, or about 100-1000 psi, or about 200-800 psi, or about 300-500 psi. In some embodiments, the heating and pressing processes can be performed simultaneously. In more detailed, one or more rollers are provided to press the metal nanowire layer 140A, and the one or more rollers are also heated. For example, the applied pressure of the rollers can be about 10-500 psi, or about 40-100 psi, and the one or more rollers are heated to about 70-200° C., or about 100-175° C. These processes can increase the conductivity of the metal nanowire layer 140A. In some embodiments, the metal nanowires 140 are preferably exposed in the reduction agent for post-treatment. For example, the metal nanowires 140 of silver material may be exposed in a silver reduction agent for the post-treatment. The silver reduction agent can be, for example, borohydride (e.g. sodium borohydride), boron nitrogen compound (e.g. dimethylaminoborane (DMAB)), or a gas reduction agent (e.g. hydrogen ($H_2$)). The exposure time is from about 10 seconds to about 30 minutes, or from about 1 minute to about 10 minutes. The above step of applying pressure may be performed in any proper step of the process according to actual needs.

The structures, materials and processes in one embodiment can refer to any of other embodiments, and are not limited to the above-mentioned individual embodiment.

In some embodiments of this disclosure, the metal layer on the peripheral area may directly contact with the metal nanowire layer to form the peripheral trace(s). Accordingly, the metal nanowires of the metal nanowire layer and the metal layer can together form a signal transmission path with low impedance for transmitting the control signals and touch sensing signals between the touch sensing electrode and the external controller. Since the structure has low impedance, the loss of signal transmission can be sufficiently reduced, thereby solving the high impedance issue of the conventional structure.

In some embodiments of this disclosure, the peripheral conductive circuit with low impedance can be formed, thereby increasing the signal transmission quality of the touch sensing signals and decreasing the loss and distortion of the transmitted touch sensing signals.

In some embodiments of this disclosure, the composite structure of the peripheral trace can be formed by a single etching process, thereby simplifying the patterning process of the peripheral traces. Thus, this disclosure can make an efficient process with reduced manufacturing costs.

In some embodiments of this disclosure, the composite structure of the peripheral trace can be formed by a single etching process, thereby reducing the amount of the alignment steps in the manufacturing process, and thus decreasing the possible mistakes in the conventional multiple alignment steps.

In some embodiments of this disclosure, the composite structure of the peripheral trace can be formed by a single etching process, so that the reserved alignment deviation space is not needed, thereby effectively decreasing the width of the peripheral area.

In some embodiments of this disclosure, the etching inhibitor is added to protect the touch sensing electrode in the touch sensing area from the etchant during the patterning process, thereby decreasing the effect of the etching solution on the optical and electrical performances of the touch sensing electrode.

In some embodiments of this disclosure, the anti-etching layer is directly formed on the metal nanowire layer for protecting the touch sensing electrode in the touch sensing area during the patterning process, thereby decreasing the effect of the etching solution on the optical and electrical performances of the touch sensing module.

In some embodiment embodiments of this disclosure, the above-mentioned processes can be integrated in the roll-to-roll manufacturing technology, which can be used in the continuous type and batch type manufacturing of the touch sensing panel with the single-sided/double-sided electrode structures.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A touch sensing panel, comprising:
    a substrate comprising a touch sensing area and a peripheral area;
    a touch sensing electrode formed on the touch sensing area of the substrate;
    an etching-inhibition unit formed at least on the touch sensing area; and
    a peripheral trace formed on the peripheral area of the substrate, wherein the touch sensing electrode is electrically connected with the peripheral trace;
    wherein the touch sensing electrode comprises a first portion of a metal nanowire layer, the peripheral trace comprises a metal layer and a second portion of the metal nanowire layer, the metal layer directly contacts the second portion of the metal nanowire layer, and wherein the metal layer and the second portion of the metal nanowire layer have a co-planar etch-surface.

2. The touch sensing panel according to claim 1, wherein the etching-inhibition unit comprises an etching inhibitor added in the metal nanowire layer, the touch sensing electrode comprises the etching inhibitor, and the peripheral trace comprises the etching inhibitor.

3. The touch sensing panel according to claim 2, wherein the etching inhibitor is present in the metal nanowire layer at 1%-40% by weight.

4. The touch sensing panel according to claim 1, further comprising an overcoat layer formed on the metal nanowire layer, wherein the etching-inhibition unit comprises an etching inhibitor added in the overcoat layer.

5. The touch sensing panel according to claim 1, wherein the etching-inhibition unit comprises an anti-etching layer formed on the first portion of the metal nanowire layer, and the touch sensing electrode and the anti-etching layer have the same pattern.

6. The touch sensing panel according to claim 5, wherein the anti-etching layer is a patterned photoresist material, and the photoresist material is formed on the touch sensing area and not formed on the peripheral area.

7. The touch sensing panel according to claim 1, wherein the touch sensing electrode comprises a first touch sensing electrode disposed on an upper surface of the substrate and a second touch sensing electrode disposed on a lower surface of the substrate, wherein the etching-inhibition unit comprises a first anti-etching layer disposed on the first touch sensing electrode and a second anti-etching layer disposed on the second touch sensing electrode, the first touch sensing electrode and the first anti-etching layer have the same pattern, and the second touch sensing electrode and the second anti-etching layer have the same pattern.

8. The touch sensing panel according to claim 7, wherein the first anti-etching layer absorbs greater than about 80% of total energy of a first light emitted from a first light source, and the second anti-etching layer absorbs greater than about 80% of total energy of a second light emitted from a second light source.

9. The touch sensing panel according to claim 7, wherein a light absorption additive is present in the first anti-etching layer and the second anti-etching layer at about 0.1%-10% by weight.

10. The touch sensing panel according to claim 7, wherein the first anti-etching layer is made of a first photoresist and the second anti-etching layer is made of a second photoresist, wherein the first and the second photoresists are sensitive to lights in different wavelength ranges.

11. A manufacturing method of a touch sensing panel, comprising:
    providing a substrate, wherein the substrate comprises a touch sensing area and a peripheral area;
    forming a metal nanowire layer made of metal nanowires on the substrate, wherein the metal nanowire layer comprises a first portion on the touch sensing area and a second portion on the peripheral area;

forming an etching-inhibition unit, wherein the etching-inhibition unit is formed at least on the touch sensing area;

forming a metal layer on the metal nanowire layer, wherein the metal layer comprises a first portion on the touch sensing area and a second portion on the peripheral area;

removing the first portion of the metal layer; and performing a patterning process, wherein the patterning process comprises: patterning the first portion of the metal nanowire layer to form a touch sensing electrode on the touch sensing area and simultaneously patterning the second portion of the metal layer and the second portion of the metal nanowire layer to form a peripheral trace on the peripheral area.

12. The manufacturing method according to claim 11, wherein the forming the etching-inhibition unit comprises adding an etching inhibitor in the metal nanowire layer.

13. The manufacturing method according to claim 12, wherein the etching inhibitor is added to the metal nanowire layer at about 1%‑40% by weight.

14. The manufacturing method according to claim 12, wherein the removing the first portion of the metal layer comprises removing the first portion of the metal layer by a first etching solution; and wherein after the removing the first portion of the metal layer, a variation of a resistance of the metal nanowire layer is less than about 10%.

15. The manufacturing method according to claim 14, wherein the performing the patterning process comprises etching the first portion of the metal nanowire layer, the second portion of the metal layer and the second portion of the metal nanowire layer by a second etching solution.

16. The manufacturing method according to claim 11, wherein the forming the etching-inhibition unit comprises forming a patterned anti-etching layer on the first portion of the metal nanowire layer.

17. The manufacturing method according to claim 16, wherein the removing the first portion of the metal layer and the performing the patterning process are performed simultaneously with one etching solution.

18. The manufacturing method according to claim 11, wherein the forming the metal nanowire layer comprises:

forming a first metal nanowire layer on an upper surface of the substrate and forming a second metal nanowire layer on a lower surface of the substrate.

19. The manufacturing method according to claim 18, wherein the forming the etching-inhibition unit comprises: forming a patterned first anti-etching layer on the first metal nanowire layer and forming a patterned second anti-etching layer on the second metal nanowire layer; and wherein the forming the metal layer on the metal nanowire layer comprises:

forming a first metal layer on the first metal nanowire layer and forming a second metal layer on the second metal nanowire layer.

20. The manufacturing method according to claim 19, wherein the removing the first portion of the metal layer and the performing the patterning process are performed simultaneously with one etching solution, and wherein the one etching solution is used for simultaneously patterning a first portion of the first metal nanowire layer to form a first touch sensing electrode on the touch sensing area based on the patterned first anti-etching layer, patterning a first portion of the second metal nanowire layer to form a second touch sensing electrode on the touch sensing area based on the patterned second anti-etching layer, and patterning a second portion of the first metal layer, a second portion of the first metal nanowire layer, a second portion of the second metal layer and a second portion of the second metal nanowire layer to form a peripheral trace on the upper and the lower surfaces of the substrate in the peripheral area.

21. The manufacturing method according to claim 20, wherein the first anti-etching layer absorbs greater than about 80% of total energy of a first light emitted from a first light source, and the second anti-etching layer absorbs greater than about 80% of total energy of a second light emitted from a second light source.

22. The manufacturing method according to claim 20, wherein a light absorption additive is added to the first anti-etching layer and the second anti-etching layer at about 0.1%‑10% by weight.

23. The manufacturing method according to claim 20, wherein the first anti-etching layer is made of a first photoresist and the second anti-etching layer is made of a second photoresist, wherein the first and the second photoresists are sensitive to lights in different wavelength ranges.

* * * * *